United States Patent
Oshiyama et al.

(10) Patent No.: US 7,790,890 B2
(45) Date of Patent: Sep. 7, 2010

(54) ORGANIC ELECTROLUMINESCENCE ELEMENT MATERIAL, ORGANIC ELECTROLUMINESCENCE ELEMENT, DISPLAY DEVICE AND ILLUMINATION DEVICE

(75) Inventors: Tomohiro Oshiyama, Tokyo (JP); Hiroshi Kita, Tokyo (JP); Eisaku Katoh, Tokyo (JP); Yoshiyuki Suzuri, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 1027 days.

(21) Appl. No.: 10/598,971
(22) PCT Filed: Mar. 31, 2004
(86) PCT No.: PCT/JP2005/004678
§ 371 (c)(1),
(2), (4) Date: Sep. 15, 2006
(87) PCT Pub. No.: WO2005/097940
PCT Pub. Date: Oct. 20, 2005

(65) Prior Publication Data
US 2007/0196687 A1 Aug. 23, 2007

(30) Foreign Application Priority Data
Mar. 31, 2004 (JP) .............................. 2004-103247

(51) Int. Cl.
C07F 15/00 (2006.01)
H01L 51/54 (2006.01)
C09K 11/06 (2006.01)

(52) U.S. Cl. .............................. 546/10; 546/13; 546/84; 428/690; 428/917; 313/504; 313/506; 257/E51.041

(58) Field of Classification Search .................. 546/10, 546/13, 84; 428/690, 917; 313/504, 506; 257/E51.041
See application file for complete search history.

(56) References Cited

U.S. PATENT DOCUMENTS

2003/0068526 A1* 4/2003 Kamatani et al. ........... 428/690
2004/0058194 A1* 3/2004 Stossel et al. ............... 428/690

FOREIGN PATENT DOCUMENTS

| JP | 2003-342284 | 12/2003 |
| JP | 2005-23071 | 1/2005 |
| WO | WO 03/079736 A1 * | 9/2003 |

* cited by examiner

Primary Examiner—Ling-Siu Choi
Assistant Examiner—Vu A Nguyen
(74) Attorney, Agent, or Firm—Lucas & Mercanti, LLP

(57) ABSTRACT

According to this invention, it is possible to provide an organic electroluminescence element material comprising a metal complex having a specific ligand, and an organic electroluminescence element which exhibits high emission efficiency as well as long emission life, employing the organic electroluminescence element material, and to provide an illumination device and a display device. The electroluminescence element material is characterized by containing a metal complex having a ligand represented by following Formula (1).

Formula (1)

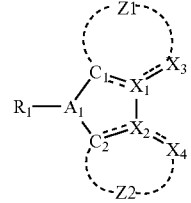

14 Claims, 5 Drawing Sheets

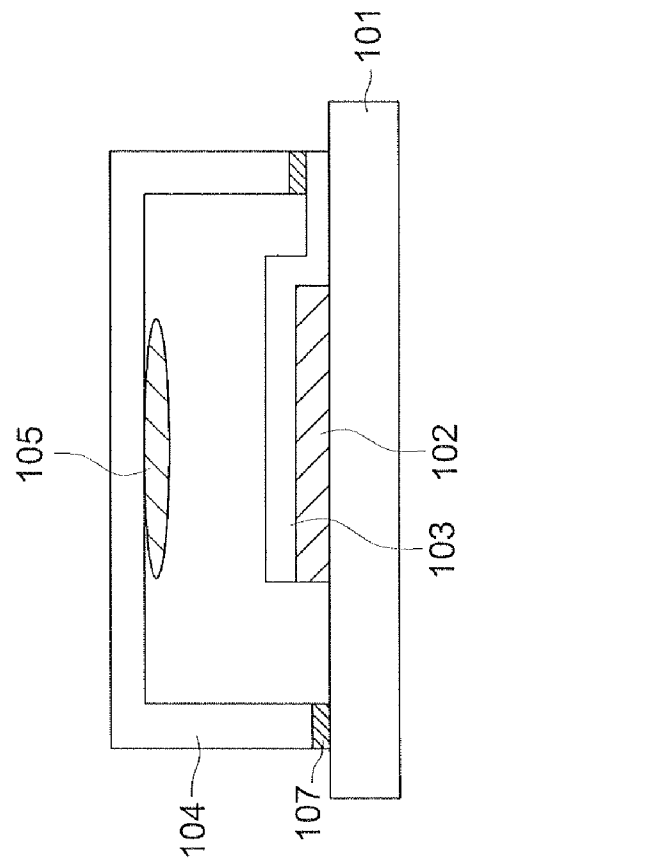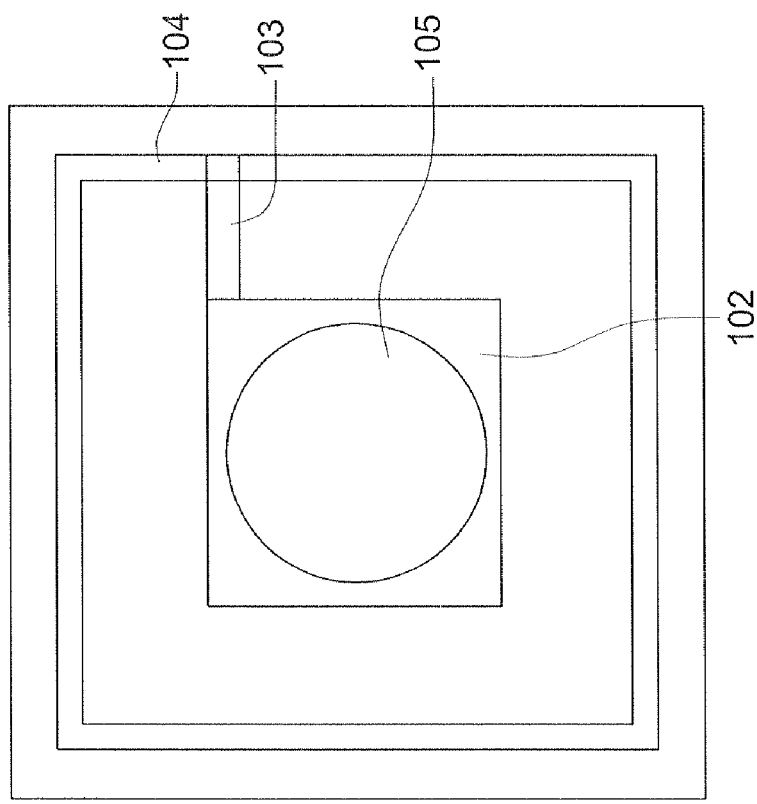

ORGANIC ELECTROLUMINESCENCE ELEMENT MATERIAL, ORGANIC ELECTROLUMINESCENCE ELEMENT, DISPLAY DEVICE AND ILLUMINATION DEVICE

FIELD OF THE INVENTION

The present invention relates to an organic electroluminescence element material, an organic electroluminescence element, a display device and an illumination device.

BACKGROUND OF THE INVENTION

Conventionally, an emission type electronic display device includes an electroluminescence display (hereinafter, referred to as an ELD). A constituent element of ELD includes such as an inorganic electroluminescence element and an organic electroluminescence element (hereinafter, referred to as an organic EL element). An inorganic electroluminescence element has been utilized as a flat light source, however, requires a high voltage of alternating current to operate an emission element. An organic electroluminescence element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence.phosphorescence) at the time of deactivation of said exciton; the emission is possible at a voltage of approximately a few to a few tens volts, and an organic electroluminescence element is attracting attention with respect to such as superior viewing angle and high visual recognition due to a self-emission type as well as space saving and portability due to a completely solid element of a thin layer type.

However, in an organic electroluminescence in view of the future practical application, desired has been development of an organic EL element which efficiently emits at a high luminance with a low electric consumption.

In Japanese Patent No. 3093796, a slight amount of a fluorescent substance has been doped in a stilbene derivative, distilylarylene derivative or a tristilylarylene derivative, to achieve improved emission luminance and a prolonged life of an element.

Further, there are known such as an element having an organic emission layer comprising a 8-hydroxyquinoline aluminum complex as a host compound which is doped with a slight amount of a fluorescent substance (for example, JP-A 63-264692 (hereinafter, JP-A refers to Japanese Patent Publication Open to Public Inspection No.)) and an element having an organic emission layer comprising a 8-hydroxyquinoline aluminum complex as a host compound which is doped with quinacridone type dye (for example, JP-A 3-255190).

In the case of utilizing emission from an excited singlet as described above, since a generation ratio of a singlet exciton to a triplet exciton is 1/3, that is, a generation probability of an emitting exciton species is 25% and a light taking out efficiency is approximately 20%, the limit of a quantum efficiency ($\eta$ext) of taking out is said to be 5%.

However, since an organic EL element which utilizes phosphorescence from an excited triplet has been reported from Princeton University (M. A. Baldo et al., Nature vol. 395, pp. 151-154 (1998)), researches on materials exhibiting phosphorescence at room temperature have come to be active.

For example, it is also disclosed in A. Baldo et al., Nature, vol. 403, No. 17, pp. 750-753 (2000), and U.S. Pat. No. 6,097,147.

Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application.

For example, in such as S. Lamansky et al., J. Am. Chem. Soc., vol. 123, p. 4304 (2001), many compounds mainly belonging to heavy metal complexes such as iridium complexes have been synthesized and studied.

Further, in aforesaid, A. Baldo et al., Nature, vol. 403, No. 17, pp. 750-753 (2000), utilization of tris(2-phenylpyridine) iridium as a dopant has been studied.

In addition to these, M. E. Tompson et al., at The 10th International Workshops on Inorganic and Organic Electroluminescence (EL'00, Hamamatsu), have studied to utilize $L_2Ir$ (acac) such as $(ppy)_2Ir(acac)$ as a dopant, Moon-Jae Youn. Og., Tetsuo Tsutsui et al., also at The 10th International Workshops on Inorganic and Organic Electroluminescence (EL'00, Hamamatsu), have studied utilization of such as tris (2-(p-toluyl)pyridine)iridium $(Ir(ptpy)_3)$ and tris(benzo[h] quinoline)iridium $(Ir(bzq)_3)$ (herein, these metal complexes are generally referred to as orthometalized iridium complexes.).

Further, in also the aforesaid, S. Lamansky et al., J. Am. Chem. Soc., vol. 123, p. 4304 (2001), studies have been carried out to prepare an element utilizing various types of iridium complexes.

Further, to obtain high emission efficiency, Ikai et al., at The 10th International Workshops on Inorganic and Organic Electroluminescence (EL'00, Hamamatsu) utilized a hole transporting compound as a host of a phosphorescent compound. Further, M. E. Tompson et al. utilized various types of electron transporting materials as a host of a phosphorescent compound doped with a new iridium complex.

An orthometalized complex provided with platinum instead of iridium as a center metal is also attracting attention. With respect to these types of complexes, many examples having a characteristic ligand are known (for example, refer to Patent Documents 1-5 and Non-Patent Document 1.).

In any case, emission luminance and emission efficiency are significantly improved compared to conventional elements because the emitting light arises from phosphorescence, however, there has been a problem of a poor emission life of the element compared to conventional elements.

Further, it is a present state that, although a blue emission material having good hue purity is required as a phosphorescent emission material provided with a high efficiency, an emission wavelength is difficult to be shortened resulting in not achieving a capability durable in a practical application. With respect to shortening of emission wavelength, heretofore, there have been known introduction of an electron attracting group such as a fluorine atom as a substituent group into phenylpyridine, and introduction of a ligand of such as picolinic acid or of a pyrazabole type (for example, refer to Patent Documents 6-8 and Non-Patent Documents 1-4.). However, when an emission wavelength is shortened to achieve blue color by utilizing these substitution effects, a high efficiency may be achieved while emission life of an orthometalized complex itself will be greatly deteriorated, which requires further improvement to overcome the trade-off relationship.

[Patent Document 1] JP-A 2002-332291

[Patent Document 2] JP-A 2002-332292

[Patent Document 3] JP-A 2002-338588
[Patent Document 4] JP-A 2002-226495
[Patent Document 5] JP-A 2002-234894
[Patent Document 6] WO 02/15645 pamphlet
[Patent Document 7] JP-A 2003-123982
[Patent Document 8] JP-A 2002-117978
[Non-Patent Document 1] Inorganic Chemistry, vol. 41, No. 12, pp. 3055-3066
[Non-Patent Document 2] Applied Physics Letters, vol. 79, p. 2082
[Non-Patent Document 3] Applied Physics Letters, vol. 83, p. 3818
[Non-Patent Document 3] New Journal of Chemistry, vol. 26, p. 1171

SUMMARY OF THE INVENTION

Problems to be Solved

This invention has been made in view of these problems, and an object of this invention is to provide an organic EL element material provided with a metal complex having a specific ligand, and an organic EL element, an illumination device and a display device, which have high emission efficiency and long emission life, by utilizing said element material.

Means to Solve the Problems

The object of this invention described above has been achieved by the following constitutions.

(Item 1)
An organic electroluminescence element material comprising a metal complex provided with a ligand represented by Formula (1).

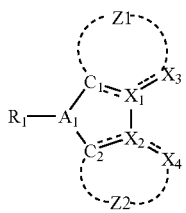

Formula (1)

(In Formula, $X_1$, $X_2$, $X_3$ and $X_4$ are each independently a carbon atom or a nitrogen atom; $C_1$ and $C_2$ are carbon atoms; $Z_1$ in conjunction with $C_1$, $X_1$ and $X_3$, and $Z_2$ in conjunction with $C_2$, $X_2$ and $X_4$, are each an atomic group which forms an aromatic hydrocarbon ring or an aromatic heterocyclic ring, respectively; $A_1$ is a nitrogen atom or a boron atom; $R_1$ is a substituent group; and a bond between $C_1$ and $X_1$, a bond between $C_2$ and $X_2$, a bond between $X_1$ and $X_3$, and a bond between $X_2$ and $X_4$, are a single bond or a double bond.)

(Item 2)
The organic electroluminescence element material of Item 1 above, wherein $R_1$ of Formula (1) is an aromatic hydrocarbon ring or an aromatic heterocyclic ring.

(Item 3)
An organic electroluminescence element material comprising a metal complex provided with a partial structure represented by Formula (2).

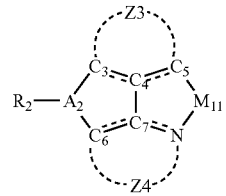

Formula (2)

(In Formula, $C_3$, $C_4$, $C_5$, $C_6$, and $C_7$ are each independently a carbon atom or a nitrogen atom; $Z_3$ in conjunction with $C_3$, $C_4$ and $C_5$ is an atomic group which forms an aromatic hydrocarbon ring or an aromatic heterocyclic ring; $Z_4$ in conjunction with $C_6$, $C_7$ and N is an atomic group which forms an aromatic heterocyclic ring; $A_2$ is a nitrogen atom or a boron atom; $R_2$ is a substituent group; $M_{11}$ is an element of the 8th to 10th groups of the periodic table; and a bond between $C_3$ and $C_4$, a bond between $C_4$ and $C_5$, a bond between $C_6$ and $C_7$, and a bond between $C_7$ and N, are a single bond or a double bond.)

(Item 4)
The organic electroluminescence element material of Item 3 above, wherein $R_2$ of Formula (2) is an aromatic hydrocarbon ring or an aromatic heterocyclic ring.

(Item 5)
The organic electroluminescence element material of Item 3 or 4 above, wherein the metal complex is provided with a partial structure represented by Formula (3) or a tautomer thereof.

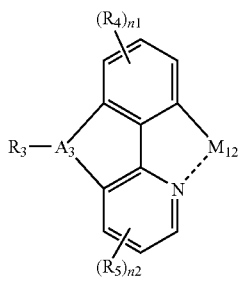

Formula (3)

(In Formula, $A_3$ is a nitrogen atom or a boron atom, $R_3$ is a substituent group, $R_4$ and $R_5$ are substituent groups, n1 and n2 are each 0, 1 or 2, and $M_{12}$ is an element of the 8th to 10th groups of the periodic table.)

(Item 6)
The organic electroluminescence element material of any one of Items 3-5, wherein $M_{11}$ or $M_{12}$ is iridium.

(Item 7)
The organic electroluminescence element material of any one of Items 3-5, wherein $M_{11}$ or $M_{12}$ is platinum.

(Item 8)
An organic electroluminescence element comprising the organic electroluminescence element material of any one of Items 1-7.

(Item 9)
The organic electroluminescence element of Item 8 above, wherein the element is provided with at least one emission layer, serving as a constituent layer, and the emission layer comprising the organic electroluminescence element material of any one of Items 1-7.

(Item 10) The organic electroluminescence element of Item 8 or 9, wherein the element is provided with at least one emission layer and one positive hole inhibition layer, serving as constituent layers, and the positive hole inhibition layer comprising the organic electroluminescence element material of any one of Items 1-7.

(Item 11) A display device comprising the organic electroluminescence element of any one of Items 8-10.

(Item 12) An illumination device comprising the organic electroluminescence element of any one of Items 8-10.

EFFECTS OF THE INVENTION

This invention has been able to provide an organic EL element material, which is a metal complex provided with a specific ligand, and an organic EL element, an illumination device and a display device having high emission efficiency and long emission life utilizing said organic EL element material.

BRIEF DESCRIPTION OF THE DRAWINGS

FIG. 6(*a*) is a plane schematic drawing of an illumination device equipped with an organic EL element.

FIG. 6(*b*) is a cross-sectional schematic drawing of an illumination device equipped with an organic EL element.

DETAILED DESCRIPTION OF THE INVENTION

Figure 1:
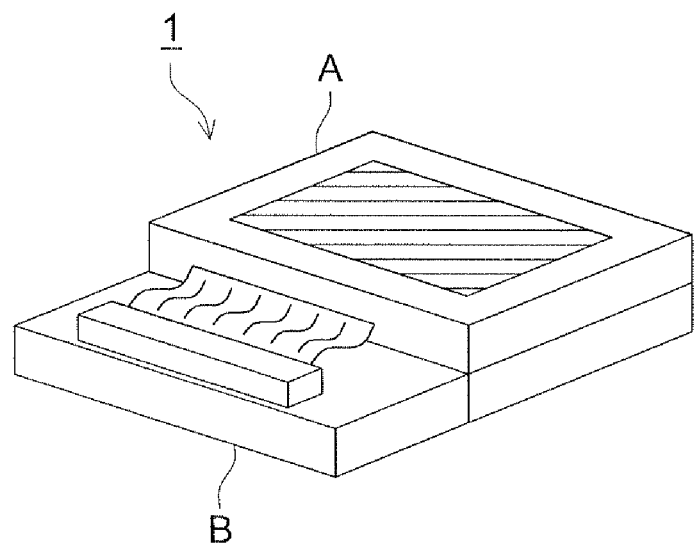
FIG. 1 is a schematic drawing to show an example of a display device constituted of an organic EL element.

In an organic electroluminescence element material of this invention, an organic EL element material, which is a metal complex having a specific ligand, could be obtained by adopting a constitution defined by any one of Items 1-7. An organic EL element having high emission efficiency and long emission life could be obtained by utilizing said organic EL element material. Further, by utilizing the aforesaid organic electroluminescence element, the display device described in Item 11 and the illumination device described in Item 12 each, exhibit high luminance as well as high durability, could be obtained.

In the following, the detail of each constituent element according to this invention will be successively explained.

The inventors of this invention, as a result of extensive study in view of the above-described problems, have found that by utilizing a metal complex having a specific ligand such as a metal complex having a ligand represented by aforesaid Formula (1), a metal complex having a partial structure represented by aforesaid Formula (2), and a metal complex having a partial structure represented by aforesaid Formula (3), in an organic EL element, the effects described in this invention can be achieved, that is, an organic EL element exhibiting high emission efficiency and long emission life can be prepared.

Herein, "a metal complex having a specific ligand" utilized in this invention is characterized by being provided with a molecular structure in which the ortho-positions of a ligand molecule, which are positioned opposite to the side to form a complex between a center metal and a ligand of a metal complex, each other are connected via one nitrogen atom or one boron atom, in the case of the complex is comprised of a ligand and a center metal.

It has been proved that, by utilizing a metal complex having a ligand characterized as described above, a short emission life, which has been a problem of an organic EL element prepared employing an organic EL element material containing a conventional metal complex, can be overcome.

Further, a layer containing the aforesaid metal complex is preferably an emission layer and/or a positive hole inhibition layer, and in the case of being contained in an emission layer, by utilizing said complex as an emission dopant in the aforesaid emission layer, elongation of emission life of an organic EL element, which is an effect of this invention, has been achieved.

The reason why elongation of emission life has been achieved by utilizing the aforesaid metal complex as an organic EL element material of this invention is on the way of analysis, however, the inventors of this invention estimate that it is because of restrain of excimer formation as a result of the flatness, with which a metal complex is essentially provided, being inhibited due to steric hindrance of a ligand having the above-described substitution mode.

Further, since a metal complex conventionally known has a high hole transporting property but a low electron transporting property, emission with electric field application is often generated on the positive hole inhibition layer or electron transfer layer side, which has been also a factor to deteriorate the life of an element. It is estimated that, by introduction of an electron transferring group containing a nitrogen atom or a boron atom as in this invention, emission at the neighborhood of the center of an emission layer becomes possible, resulting in achieving an improvement effect of the life. Herein, a layer constitution of such as an emission layer and a positive hole inhibition layer, and materials to constitute such as an emission dopant layer will be detailed later.

<Metal Complex>

A metal complex according to an organic EL element material of this invention will now be explained.

<Metal Complex Having Ligand Represented by Formula (1)>

A metal complex having a ligand represented by Formula (1) according to this invention will be explained.

First, a ligand represented by Formula (1) will be explained.

In Formula (1), each aromatic hydrocarbon group, which is formed by $Z_1$ together with $C_1$, $X_1$ and $X_3$ and by $Z_2$ together with $C_2$, $X_3$ and $X_4$, includes such as a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthene ring, a pentacene ring, a perylene ring, a pentaphene ring, a picene ring, a pyrene ring, a pyranthrene ring and an anthraanthrene ring.

Among them, preferably utilized is a benzene ring. Further, the aforesaid aromatic hydrocarbon group may be provided with a substituent group represented by $R_1$ in the aforesaid Formula (1).

In Formula (1), each aromatic heterocyclic group which is formed by $Z_1$ together with $C_1$, $X_1$ and $X_3$ and by $Z_2$ together with $C_2$, $X_3$ and $X_4$, includes such as a furan ring, a thiophene ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which at least one carbon atom constituting a carboline ring is further substituted by a nitrogen atom.

Among them preferable is a pyridine ring. Further, the aforesaid aromatic heterocyclic group may be provided with a substituent group represented by $R_1$ in the aforesaid Formula (1).

In Formula (1), a substituent group represented by $R_1$ includes an alkyl group (such as a methyl group, an ethyl group, an isopropyl group, a hydroxyethyl group, a methoxymethyl group, a trifluoromethyl group and a t-butyl group), a cycloalkyl group (such as a cyclopentyl group and a cyclohexyl group), an aralkyl group (such as a benzyl group and a 2-phenetyl group), an aromatic hydrocarbon ring (such as a phenyl group, a p-chlorophenyl group, a mesityl group, a tolyl group, a xylyl group, a biphenyl group, a naphthyl group, a anthoryl group and a phenanthoryl group), an aromatic heterocyclic ring (such as a furyl group, a thienyl group, a pyridyl group, a pyridazinyl group, a primidinyl group, a pyradinyl group, a triazinyl group, an imidazolyl group, a pyrazolyl group, a thiazolyl group, a quinazolinyl group, a carbazolyl group and a phthalazinyl group), an alkoxy group (such as a methoxy group, an ethoxy group, an isopropoxy group and butoxy group), an aryloxy group (such as a phenoxy group and a naphthyloxy group), a cyano group, a hydroxyl group, an alkenyl group (such as a vinyl group), a styryl group, a halogen atom (such as a chlorine atom, a bromine atom and a fluorine atom). These groups may be further substituted.

Among them, in this invention, at least one of groups represented by above-described $R_1$ is preferably the above-described aromatic hydrocarbon group or aromatic heterocyclic group.

A metal complex is formed by forming a coordinate bond (also referred to as complex formation) between a ligand represented by above-described Formula (1) and a center metal (may be either metal or ion).

Herein, formation of a coordinate bond between the aforesaid ligand and center metal (which will be described later) is preferably formation of a coordinate bond or a covalent bond with $X_3$ and/or $X_4$ among atoms constituting a ligand represented by aforesaid Formula (1).

<Metal Complex Having Ligand Represented by Formula (2)>

A metal complex having a partial structure represented by Formula (2) according to this invention will now be explained.

In Formula (2), an aromatic hydrocarbon ring, which is formed by $Z_3$ together with $C_3$, $C_4$ and $C_5$, is identical with an aromatic hydrocarbon ring which is formed by $Z_1$ together with $C_1$, $X_1$ and $X_3$, in aforesaid Formula (1).

In Formula (2), an aromatic heterocyclic ring, which is formed by $Z_3$ together with $C_3$, $C_4$ and $C_5$, is identical with an aromatic heterocyclic ring which is formed by $Z_1$ together with $C_1$, $X_1$ and $X_3$, in aforesaid Formula (1).

In Formula (2), an aromatic heterocyclic ring which is formed by $Z_4$ together with $C_6$, $C_7$ and N includes such as a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring and a ring in which at least one carbon atom constituting a carboline ring is further substituted by a nitrogen atom. Further, the aforesaid aromatic heterocyclic group may be provided with a substituent group represented by $R_1$ in aforesaid Formula (1).

In Formula (2), a substituent group represented by $R_2$ is identical with a substituent group represented by $R_1$ in aforesaid Formula (1).

In Formula (2), an element of the 8th-10th group in the periodic table represented by $M_{11}$ is preferably such as platinum (Pt) and iridium (Ir). Further, in Formula (2), $M_{11}$ may be either metal or ion.

<Metal Complex Having Formula (3) or Tautomer Thereof as Partial Structure>

A metal complex having Formula (3) or tautomer thereof as a partial structure will now be explained.

In Formula (2), a substituent group represented by $R_3$ is identical with a substituent group represented by $R_1$ in aforesaid Formula (1).

In Formula (3), a substituent group represented by $R_4$ and $R_5$ respectively is identical with a substituent group represented by $R_1$ in aforesaid Formula (1).

In Formula (3), an element of the 8th-10th group in the periodic table represented by $M_{12}$ is preferably such as platinum (Pt) and iridium (Ir). Further, in Formula (3), $M_{12}$ may be either metal or ion.

In the following, specific examples of a metal complex compound utilized as an organic EL element material of this invention will be shown; however, this invention is not limited thereto.

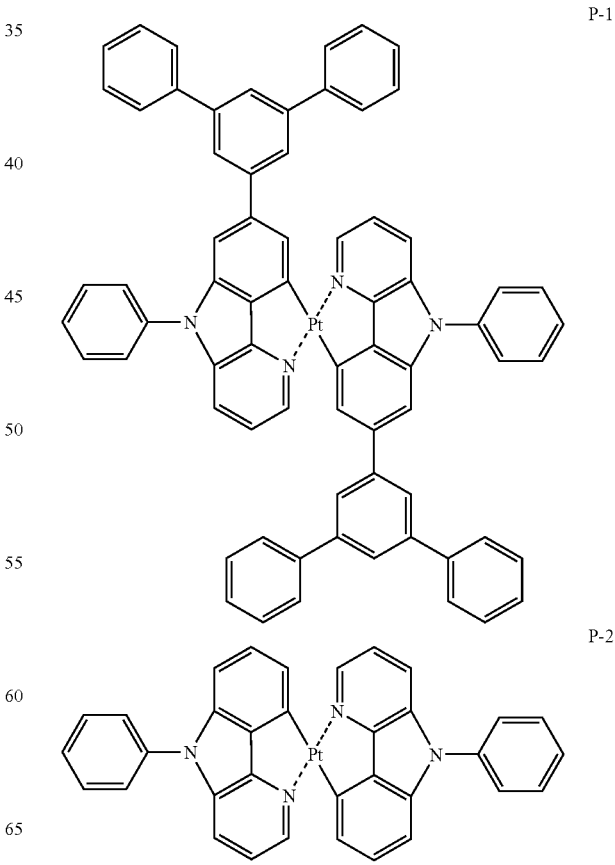

P-3
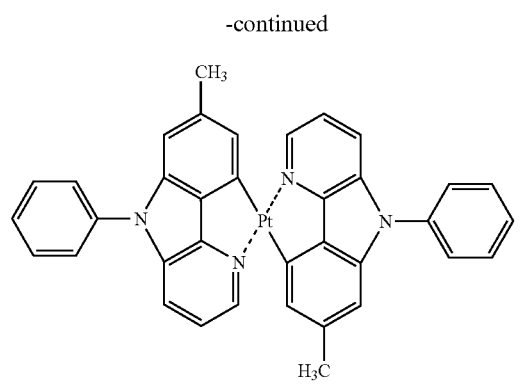
P-4
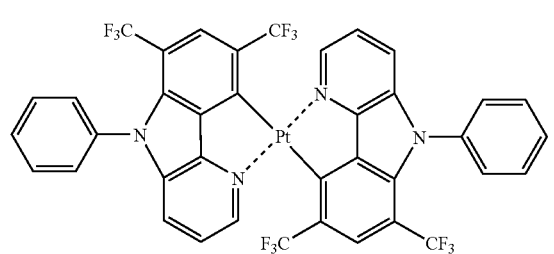
P-5
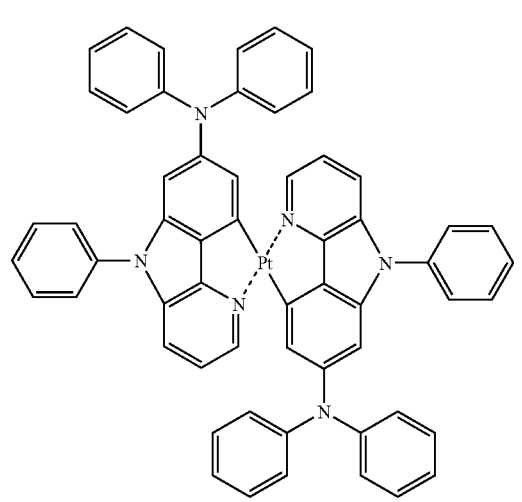
P-6
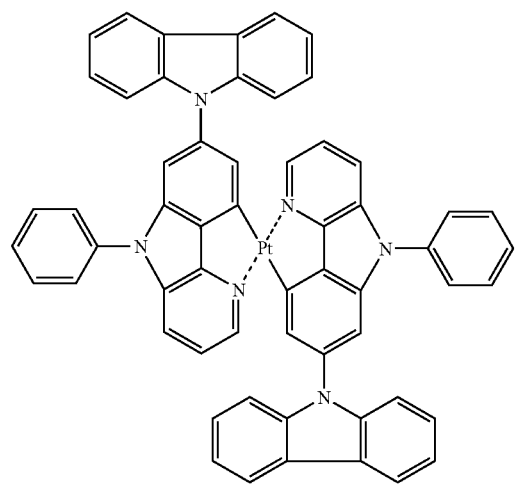
P-7
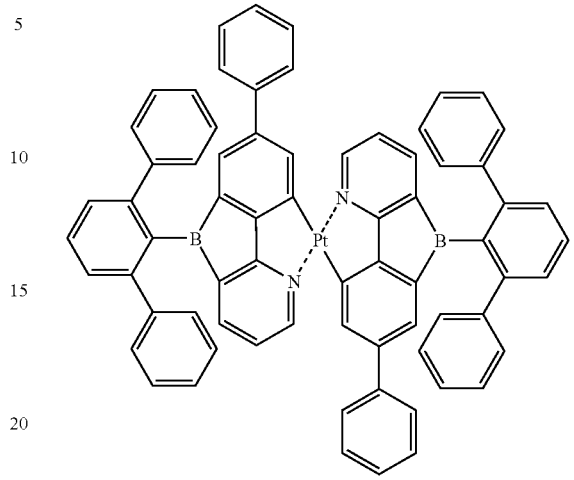
P-8
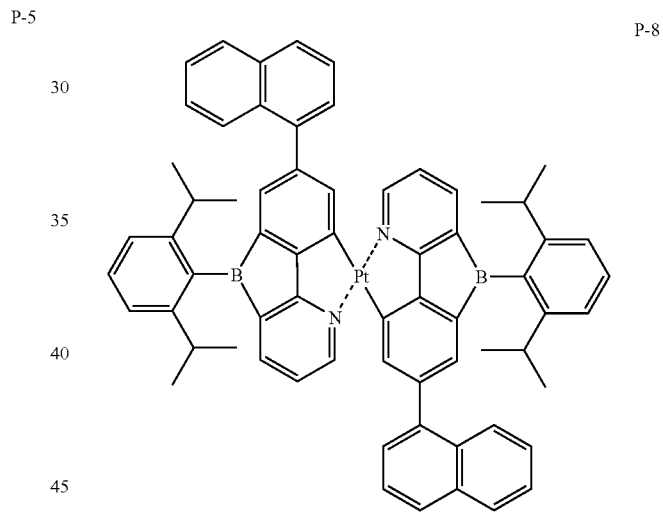
P-9
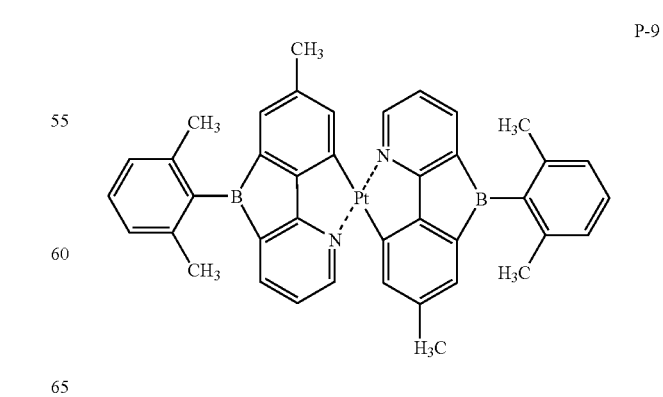

-continued
P-10
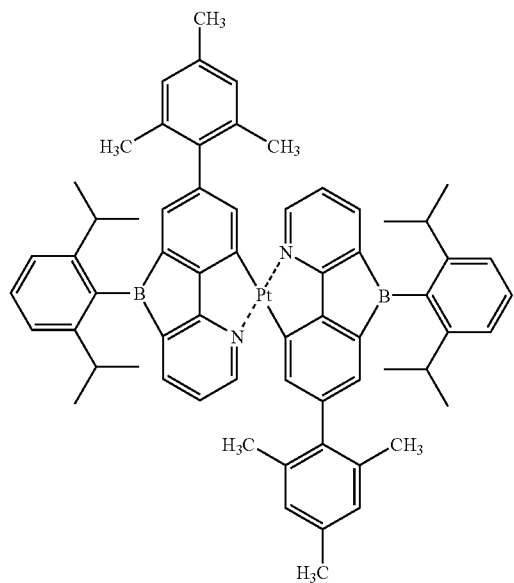
P-11
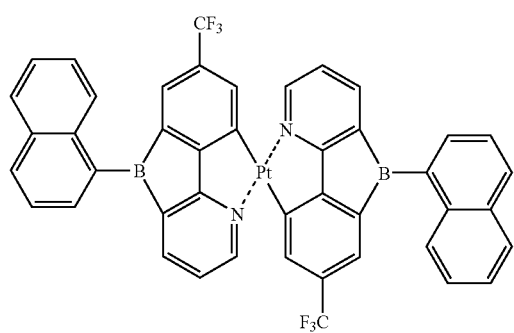
P-12
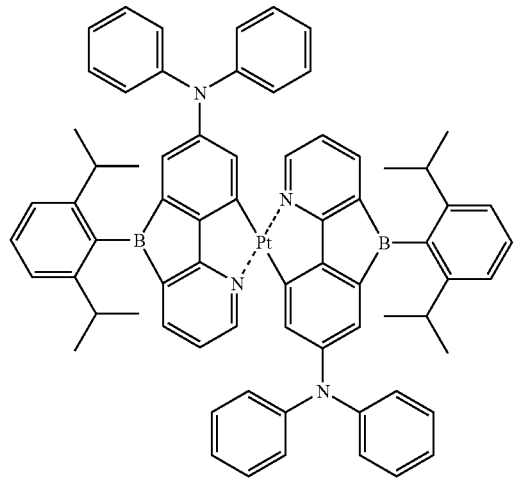
-continued
P-13
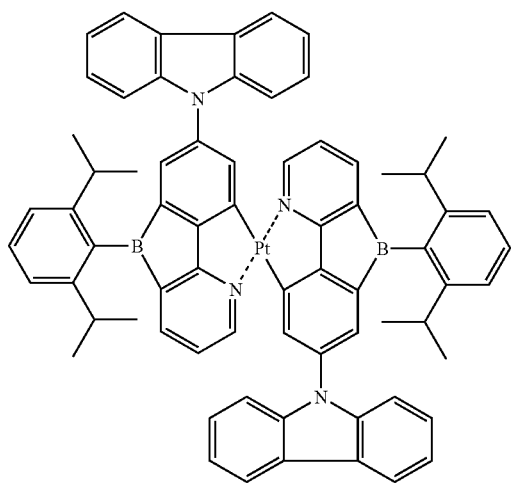
P-14
P-15
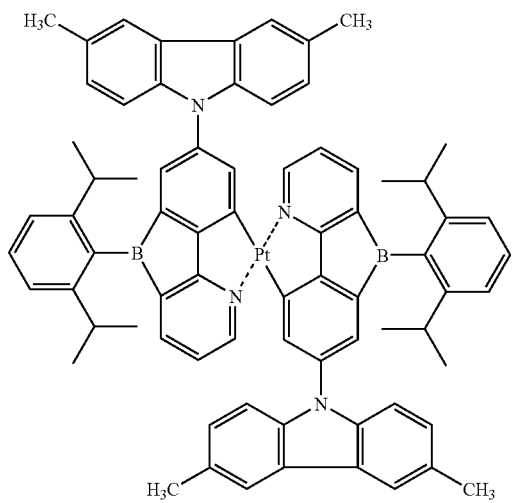

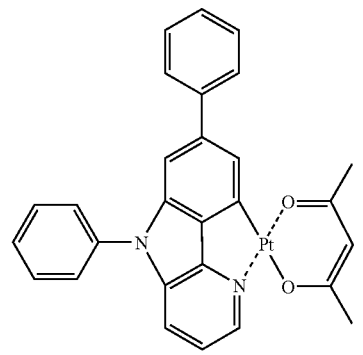
P-16
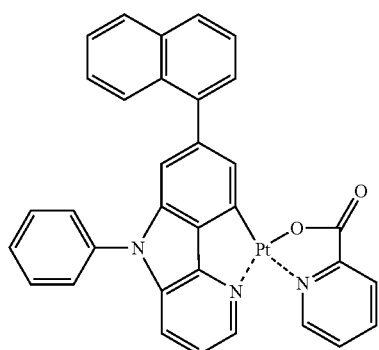
P-17
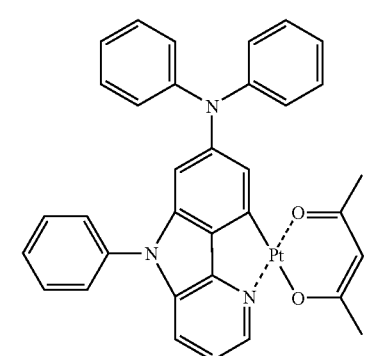
P-18
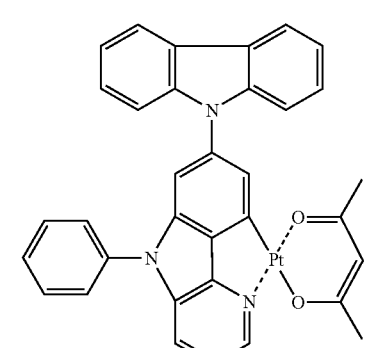
P-19
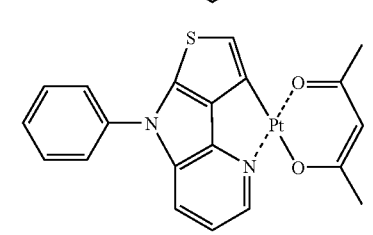
P-20
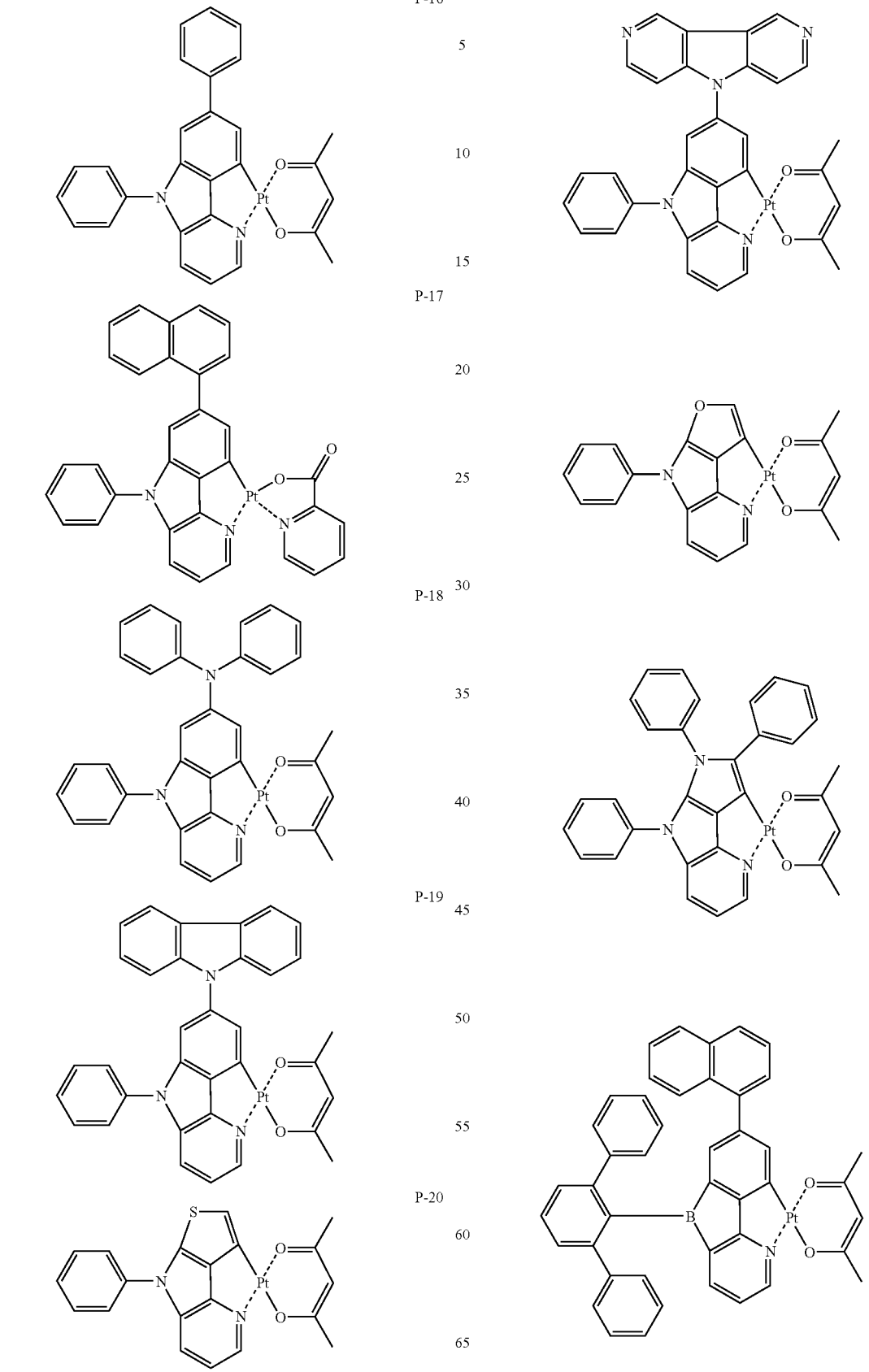
P-21
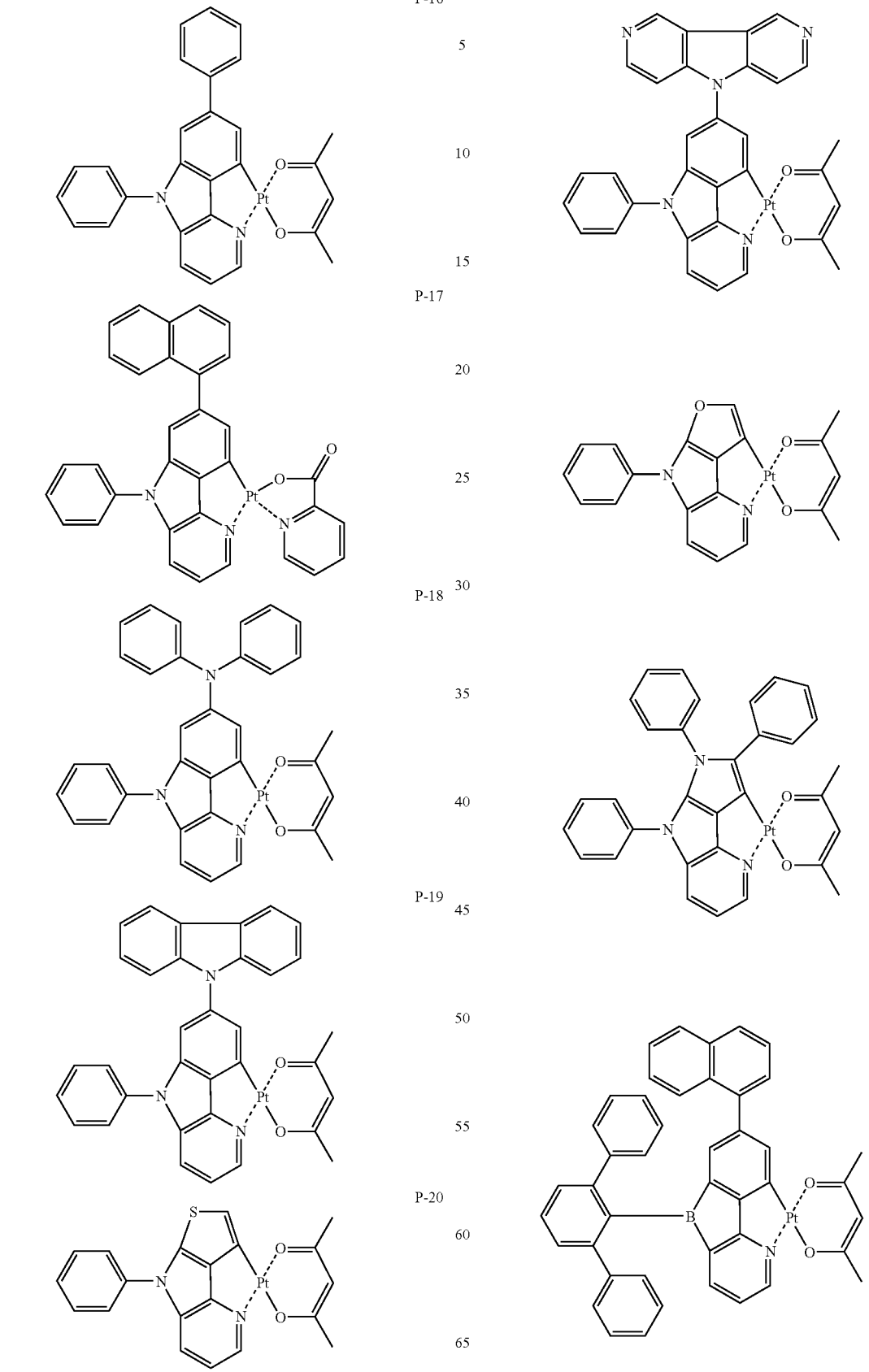
P-22
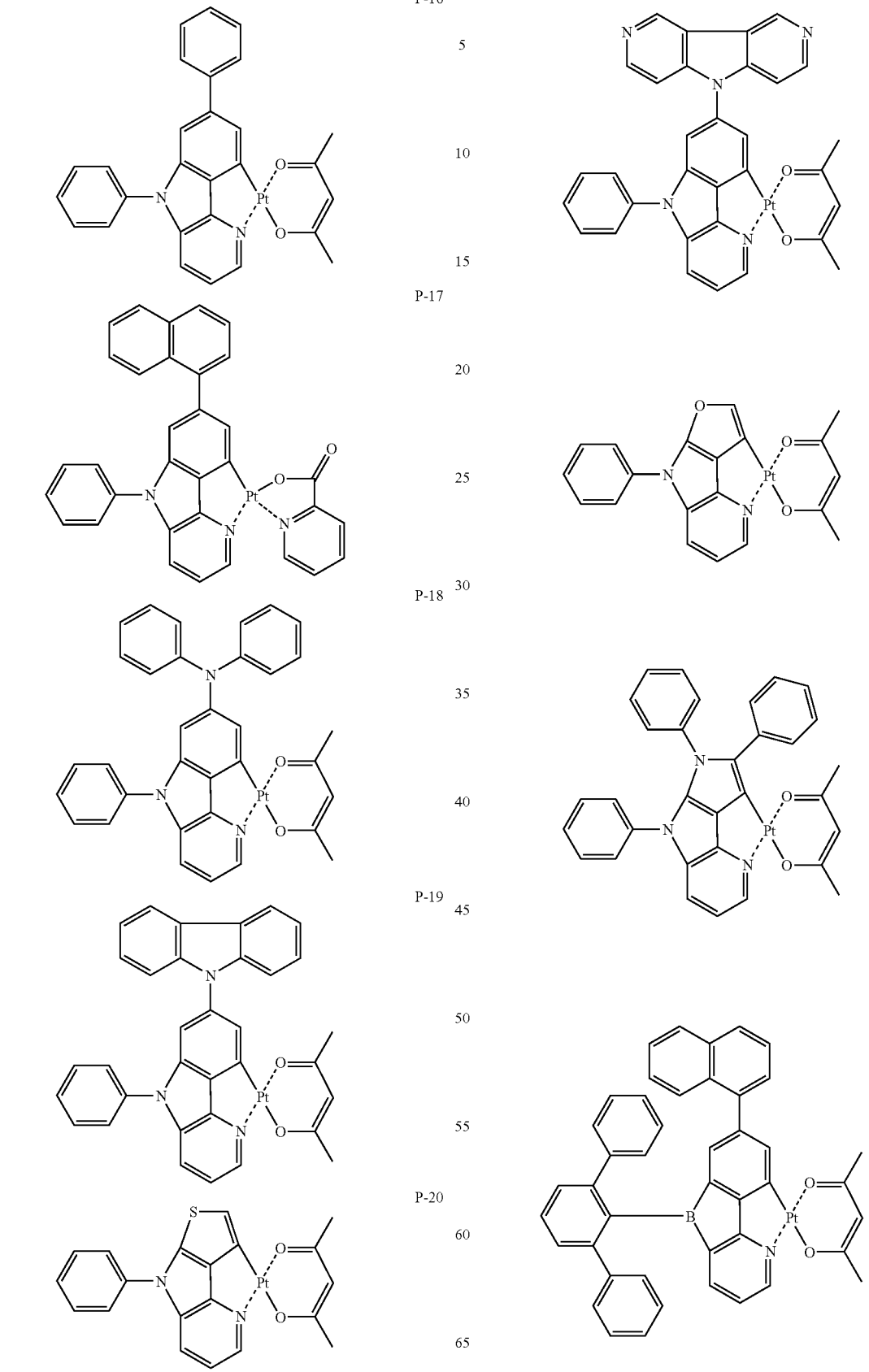
P-23
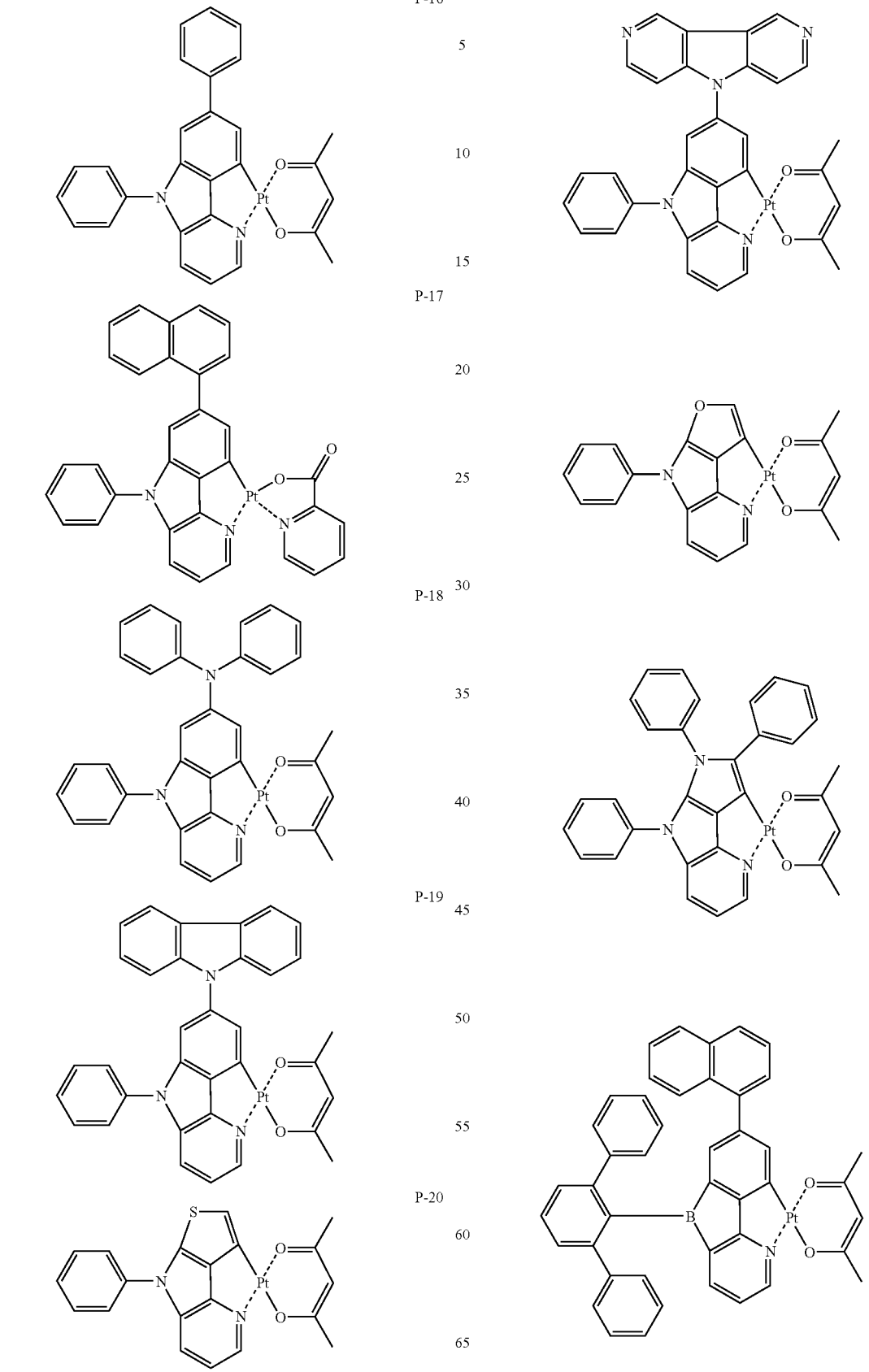
P-24

-continued
P-25
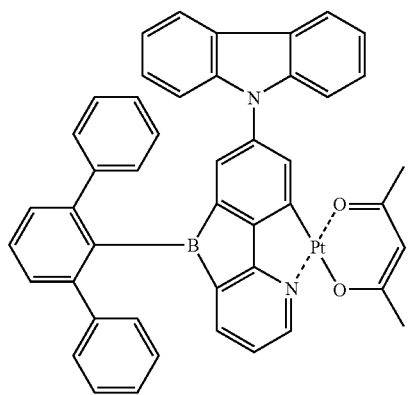
P-26
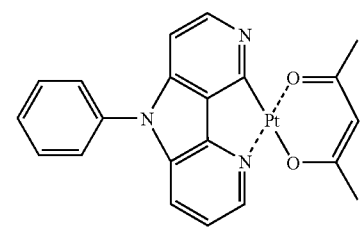
P-27
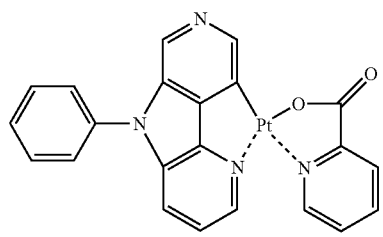
P-28
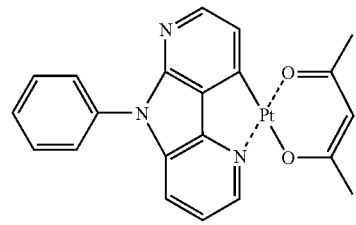
P-29
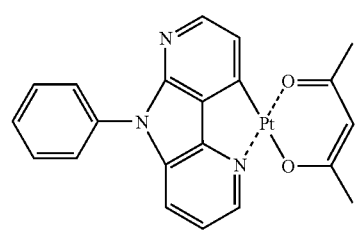
P-30
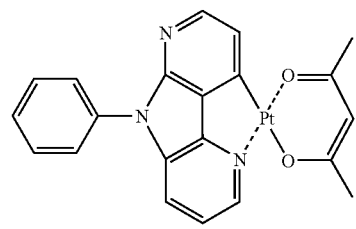
-continued
P-31
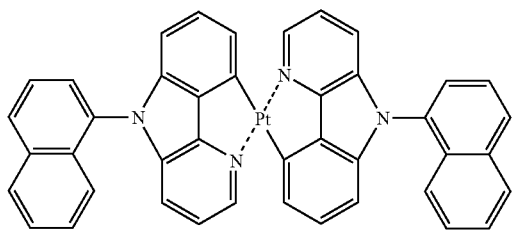
P-32
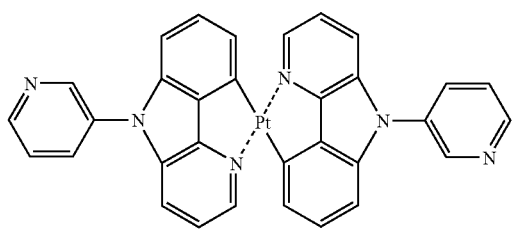
P-33
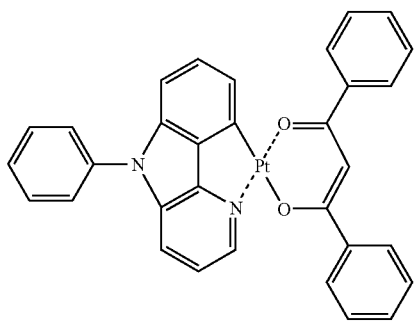
P-34
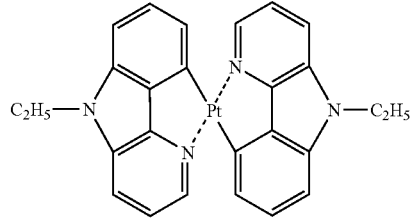
P-35
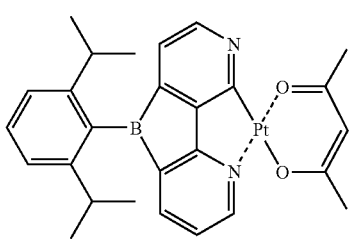
P-36

-continued
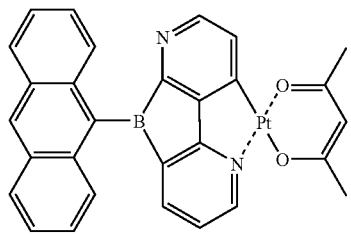
P-37
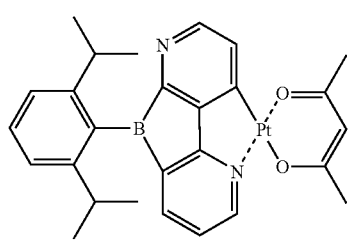
P-38
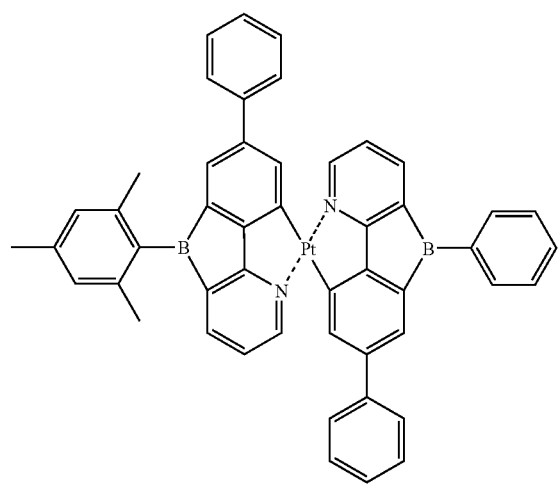
P-39
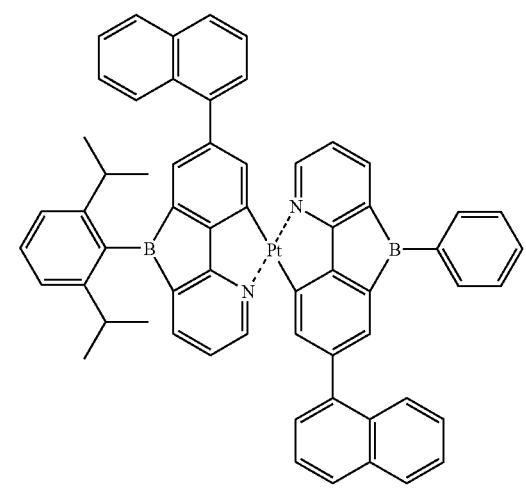
P-40
-continued
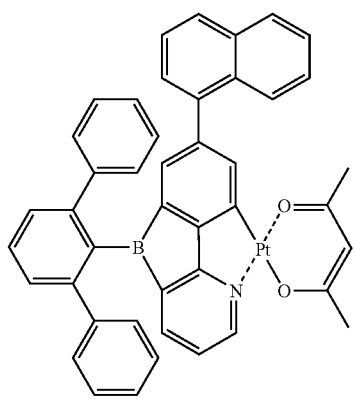
P-41
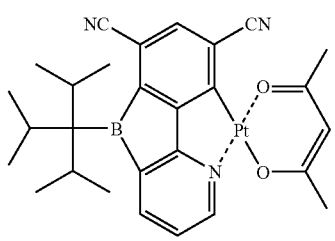
P-42
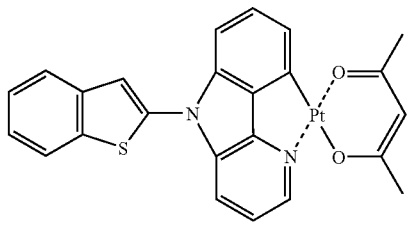
P-43
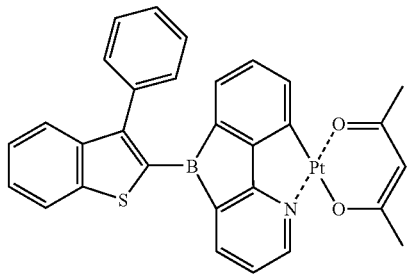
P-44
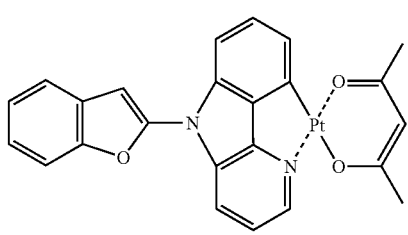
P-45

-continued
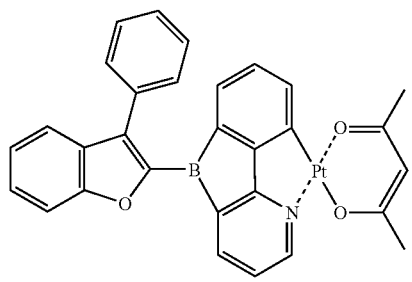
P-46
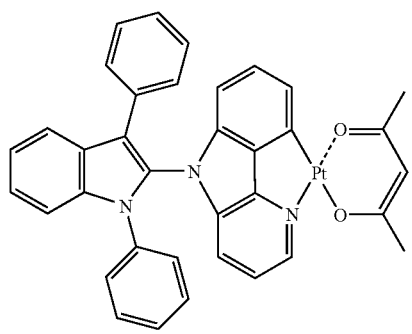
P-47
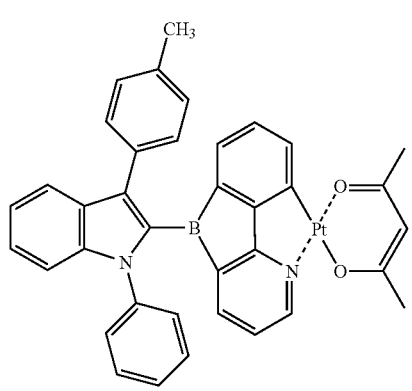
P-48
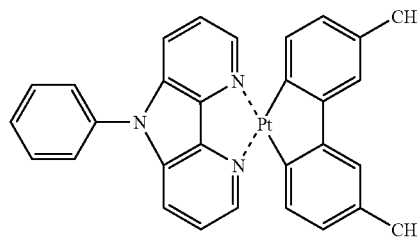
P-49
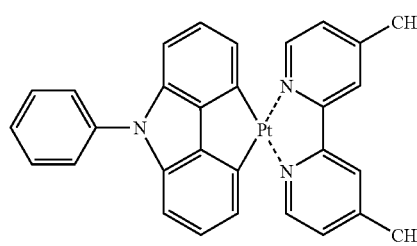
P-50
-continued
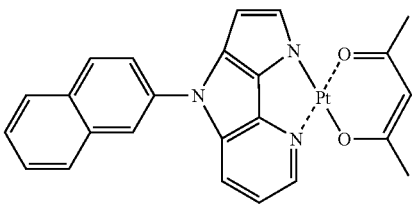
P-51
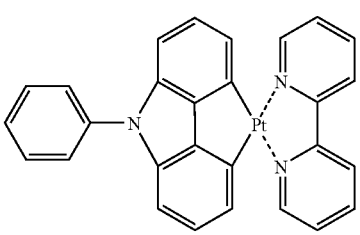
P-52
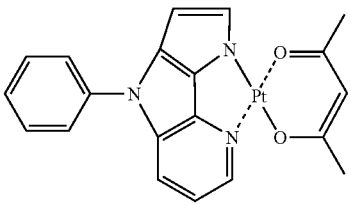
P-53
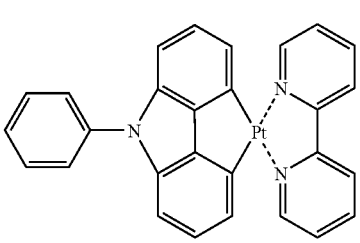
P-54
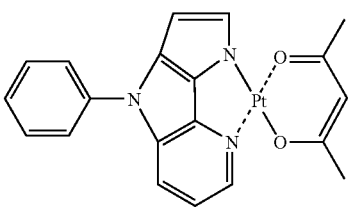
P-55
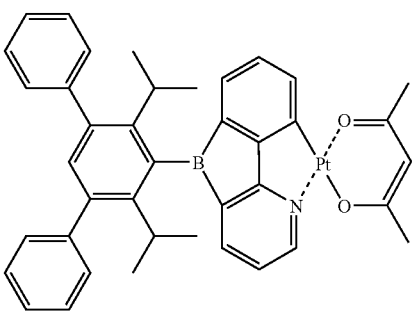
P-56

-continued
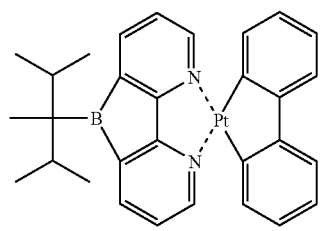
P-57
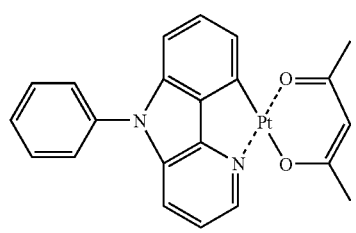
P-58
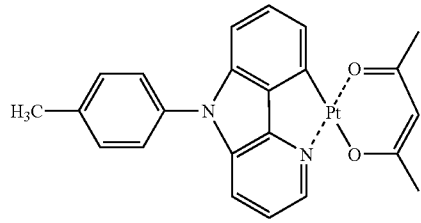
P-59
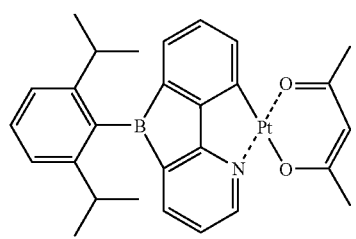
P-60
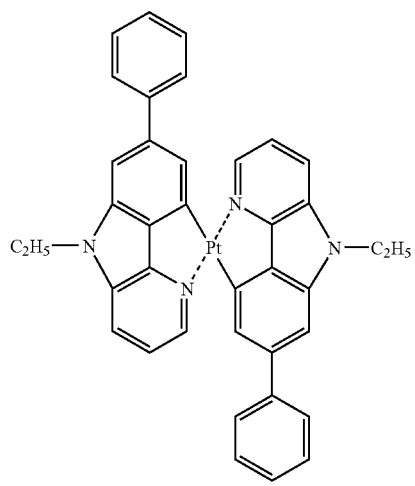
P-61
-continued
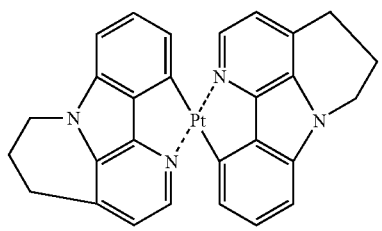
P-62
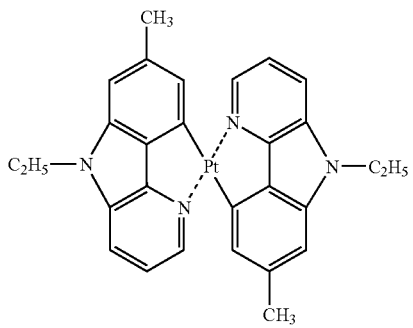
P-63
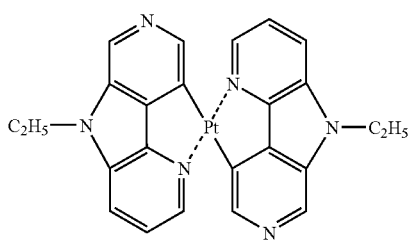
P-64
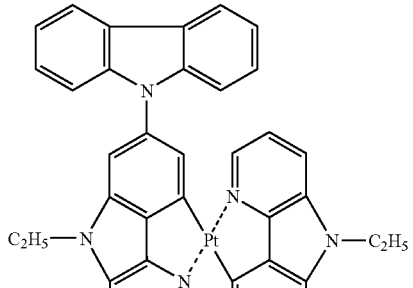
P-65
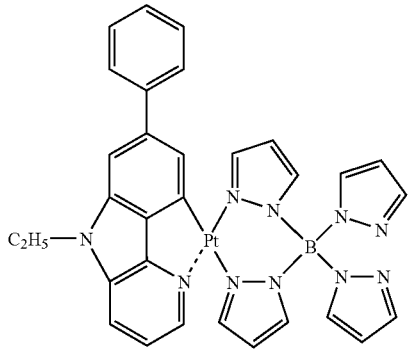
P-66

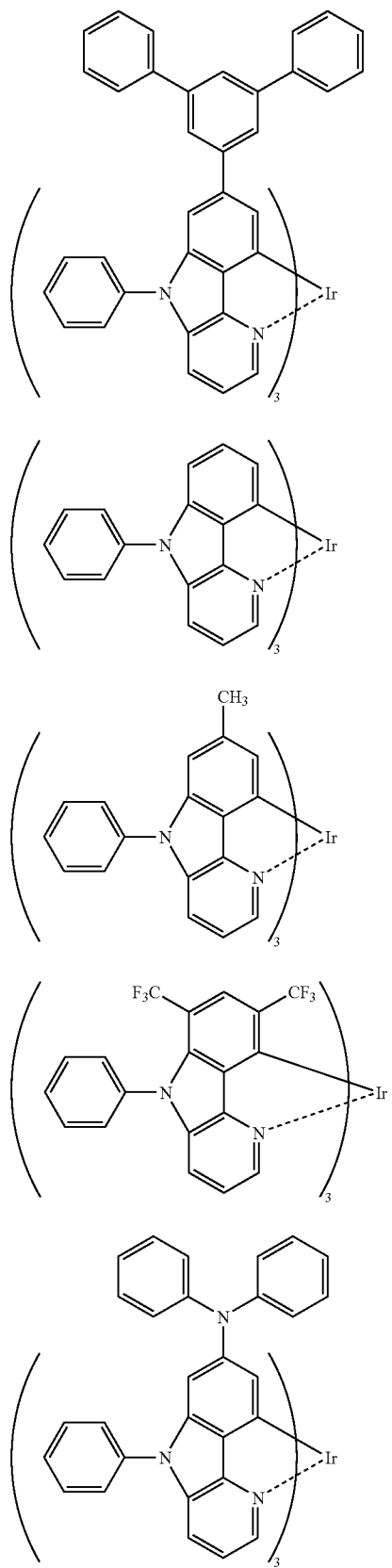
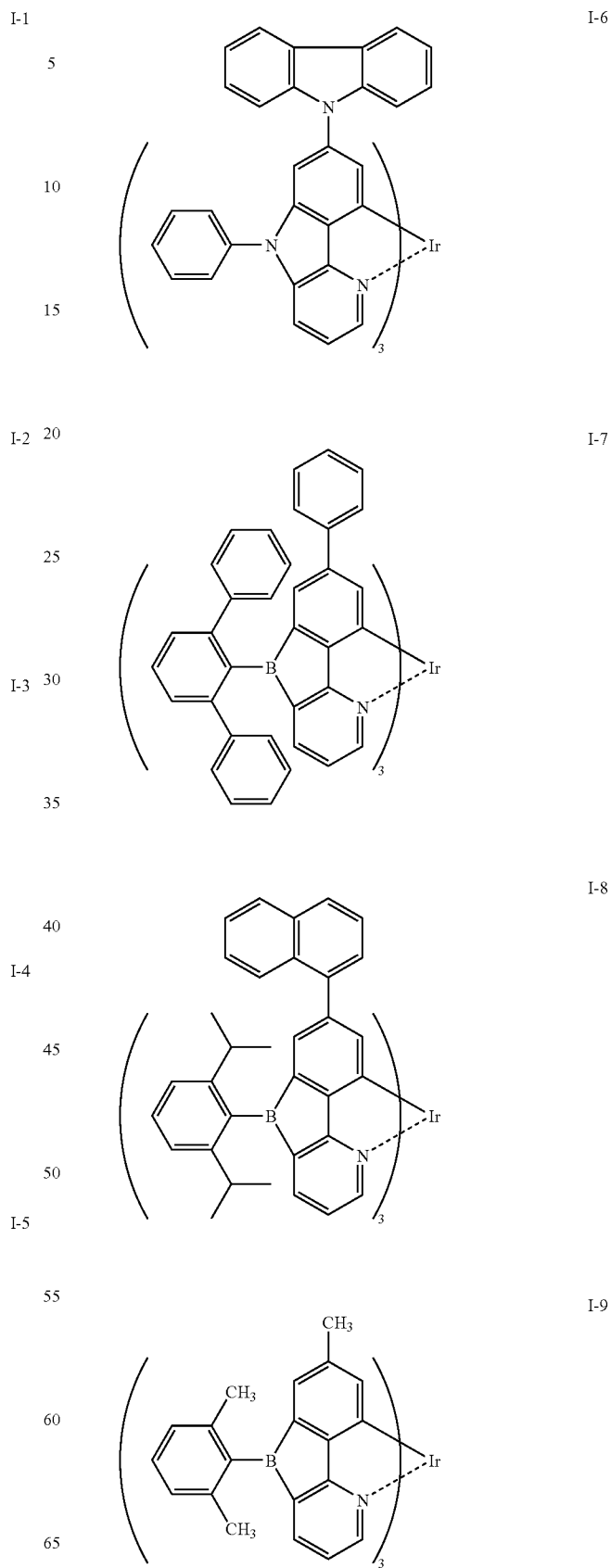

-continued
I-10
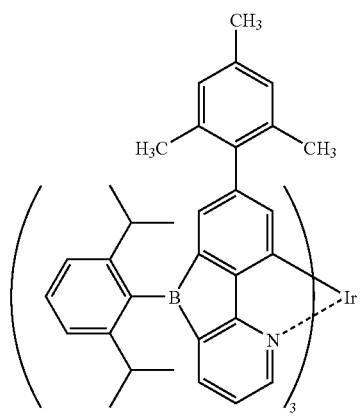
I-11
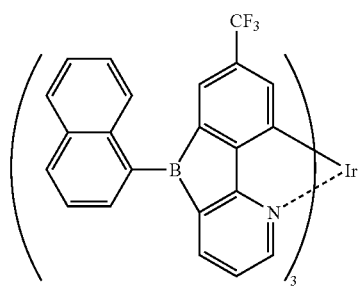
I-12
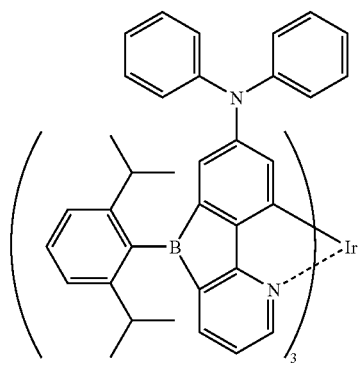
I-13
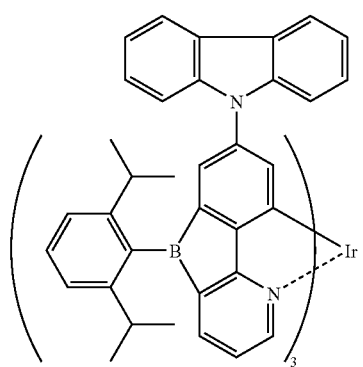
-continued
I-14
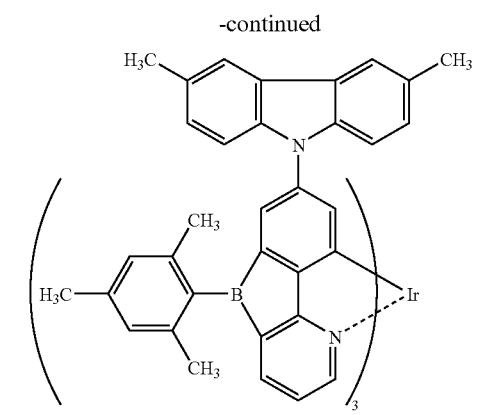
I-15
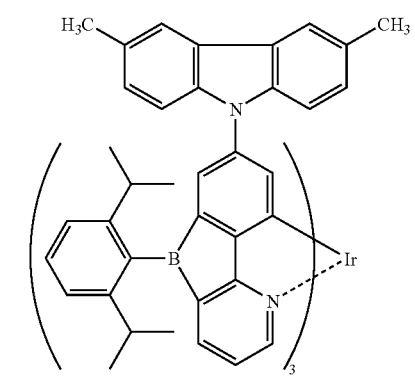
I-16
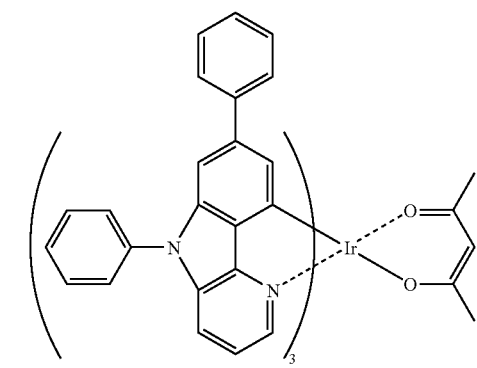
I-17
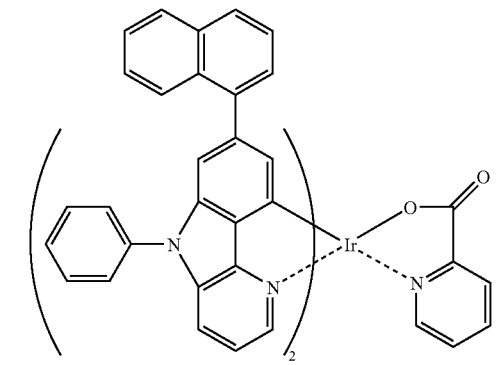

-continued
I-18
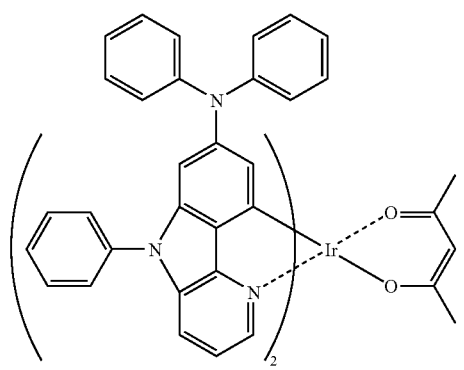
I-19
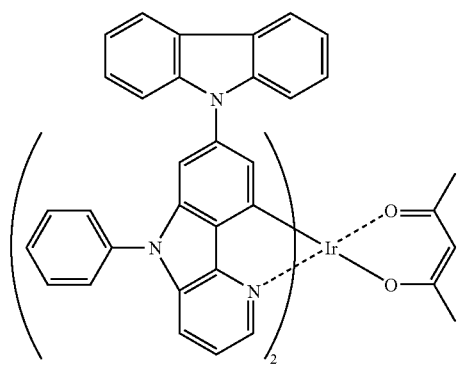
I-20
I-21
I-22
-continued
I-23
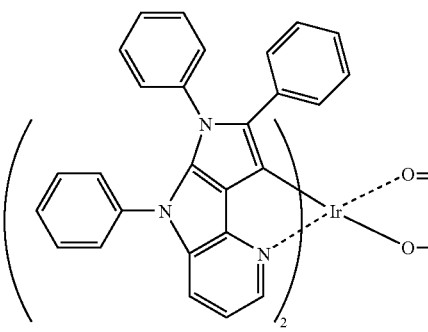
I-24
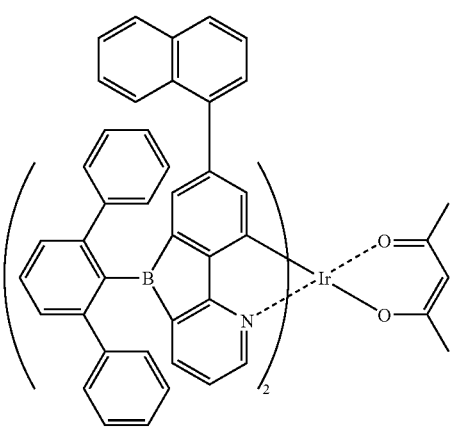
I-25
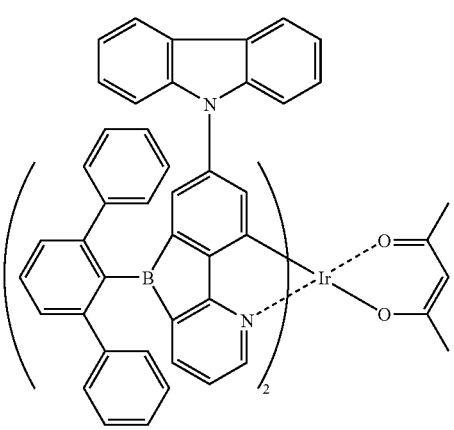
I-27
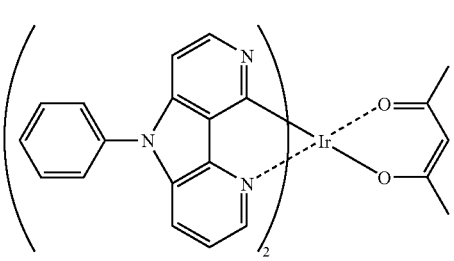

-continued
I-28
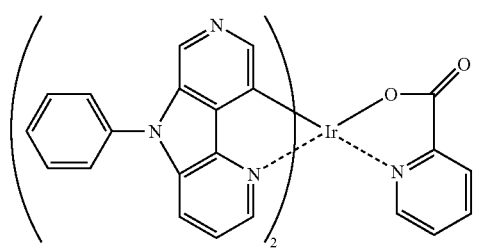
I-29
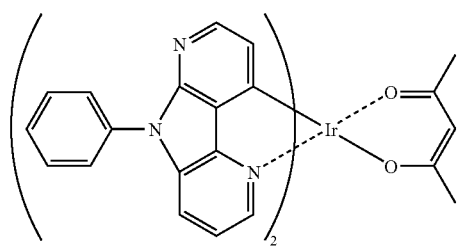
I-30
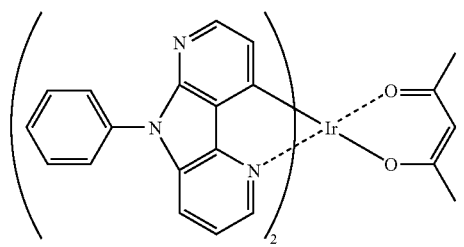
I-31
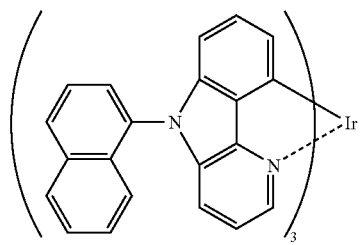
I-32
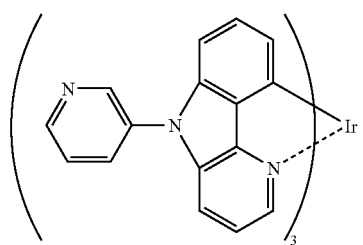
I-33
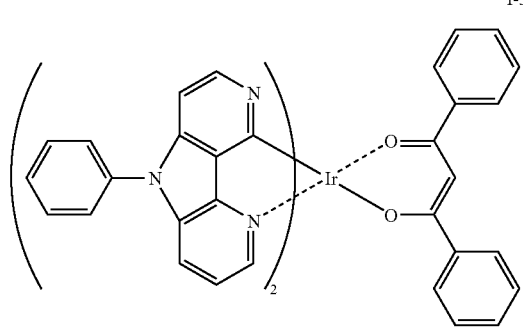
-continued
I-34
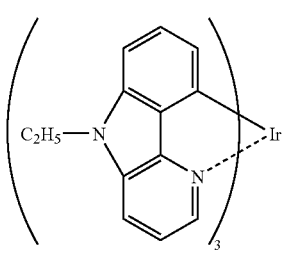
I-35
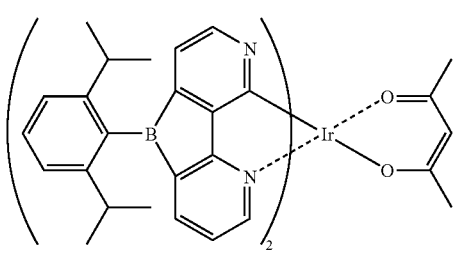
I-36
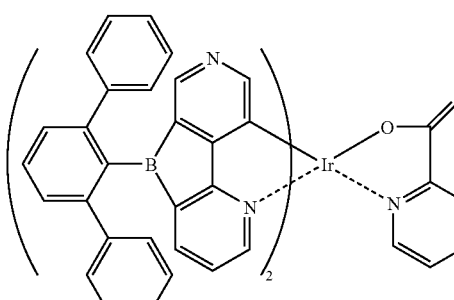
I-37
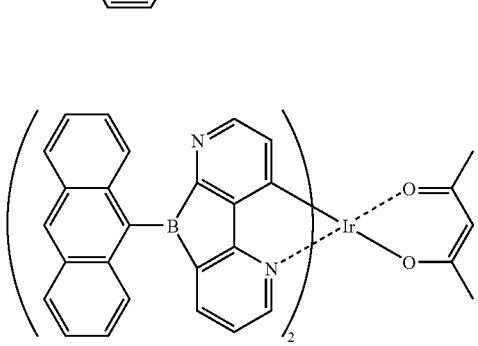
I-38
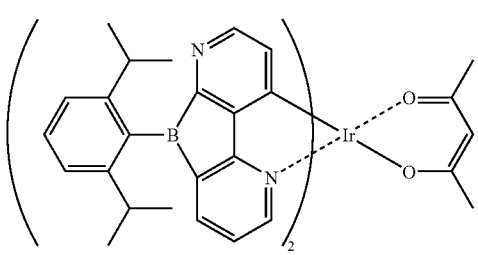

-continued
I-39
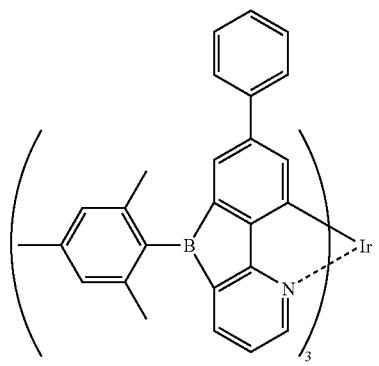
I-40
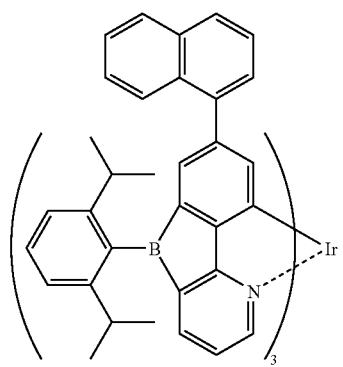
I-41
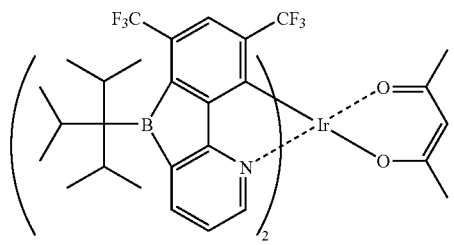
I-42
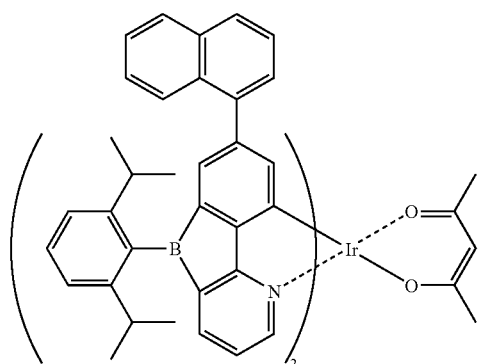
I-43
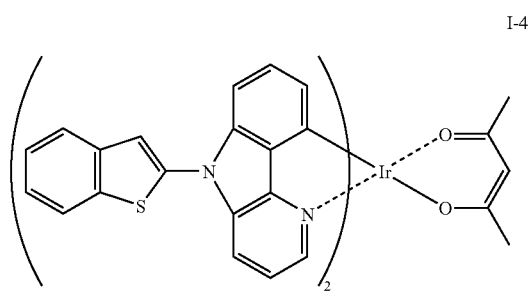
-continued
I-44
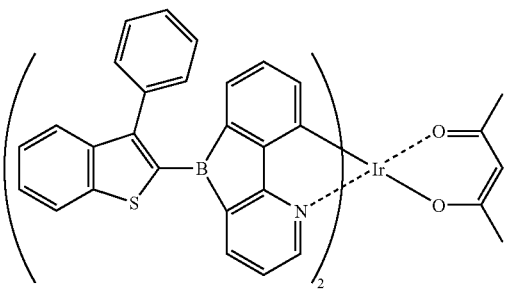
I-45
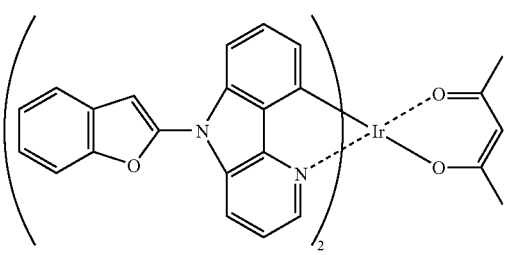
I-46
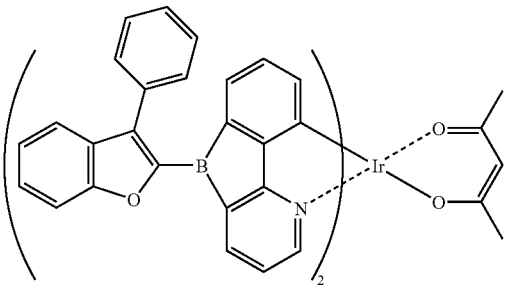
I-47
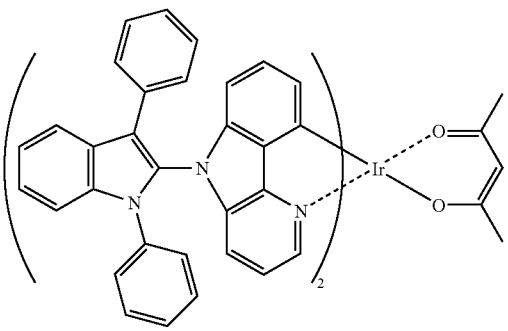

I-48
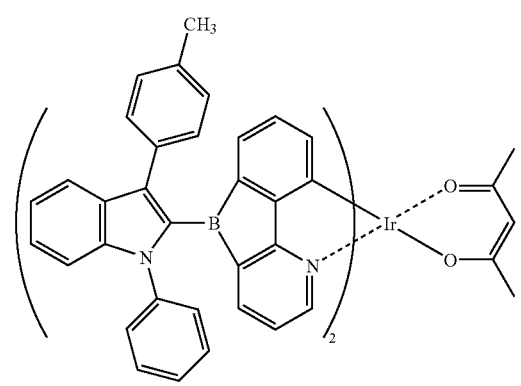
I-49
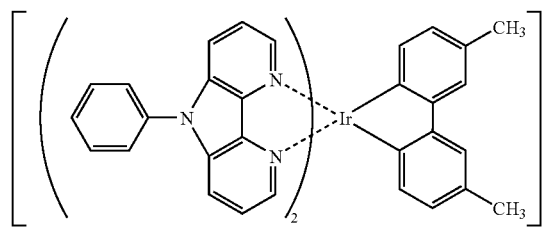
I-50
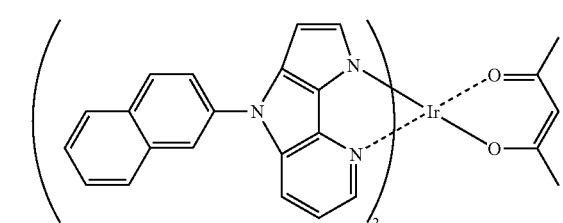
I-51
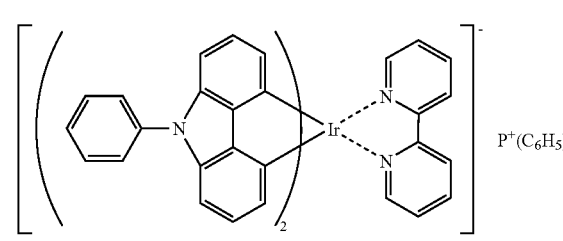
I-52
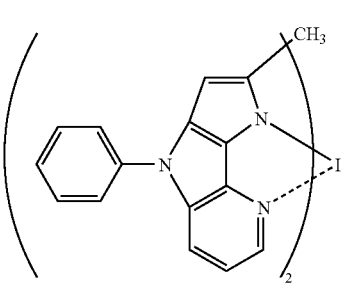
I-53
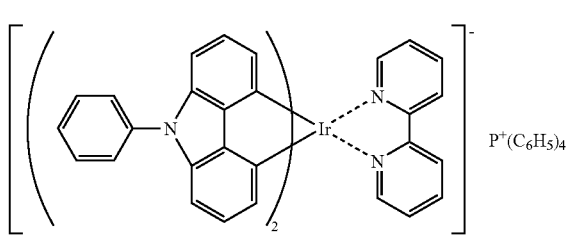
I-54
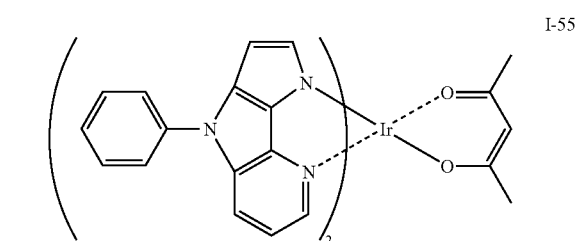
I-55
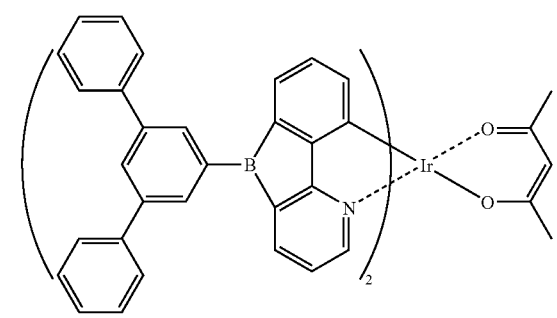
I-56
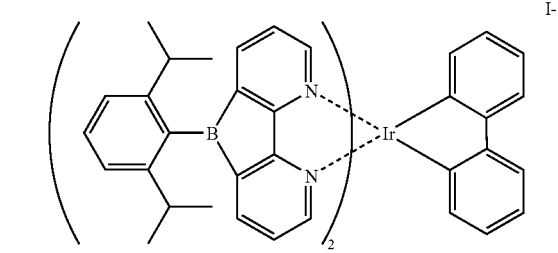
I-57
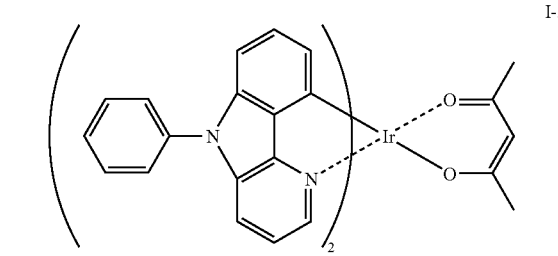
I-58

-continued
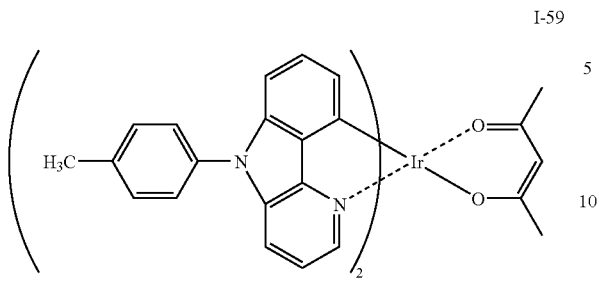
I-59
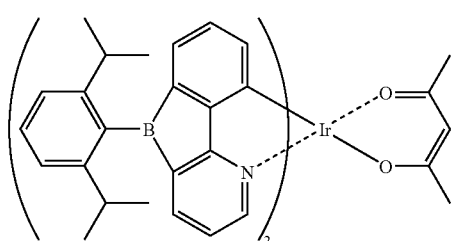
I-60
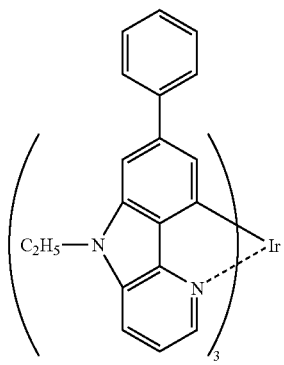
I-61
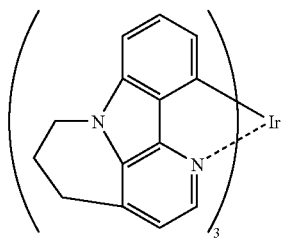
I-62
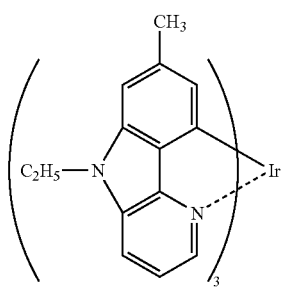
I-63
-continued
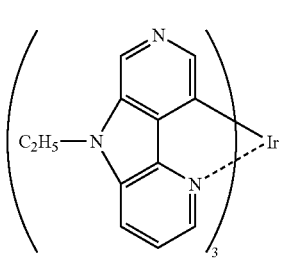
I-64
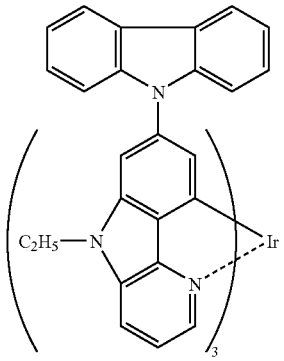
I-65
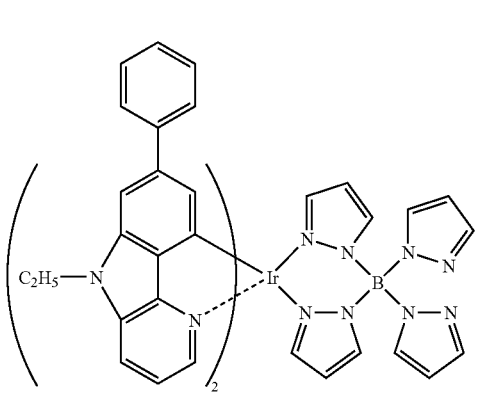
I-66
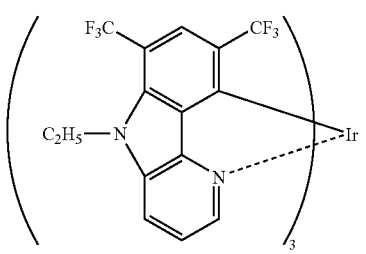
I-67
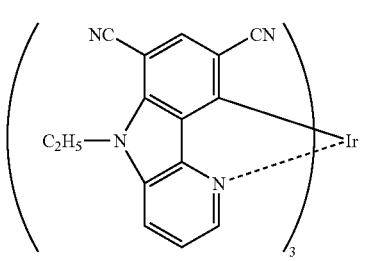
I-68

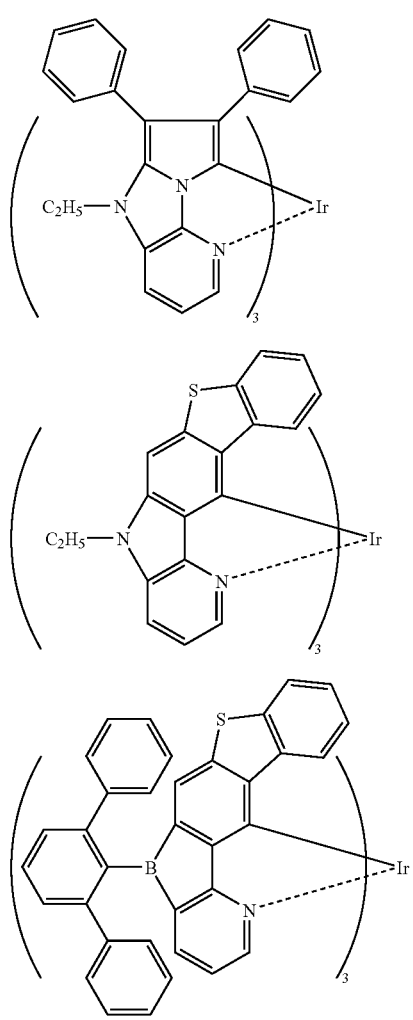

Metal complexes according to an organic EL element material of this invention can be synthesized by applying a method described in such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), Journal of the Chemical Society Perkin Transactions 1, 11, pp. 1505-1510 (1999), and reference documents described in these documents.

<Application of Organic EL Element Material Containing Metal Complex to Organic EL Element>

In the case of preparing an organic EL element by utilizing an organic EL element material of this invention, said material is preferably utilized in an emission layer or a positive hole inhibition layer among constituent layers (details will be described later) of the organic EL element. Further, the material is preferably utilized as an emission dopant in an emission layer as described above.

(Emission Host and Emission Dopant)

A mixing ratio of an emission dopant against an emission host as a primary component in an emission layer, is preferably adjusted to a range of 0.1-30 weight %.

However, plural types of compounds may be utilized in combination as an emission dopant, and the partner to be mixed may be a metal complex having a different structure, and a phosphorescent dopant or a fluorescent dopant having other structures.

Here, a dopant (such as a phosphorescent dopant and a fluorescent dopat) which may be utilized together with a metal complex employed as an emission dopant will be described.

An emission dopant is roughly classified into two types, that is, a fluorescent dopant which emits fluorescence and a phosphorescent dopant which emits phosphorescence.

A typical example of the former (a fluorescent dopant) includes cumaline type dye, pyrane type dye, cyanine type dye, croconium type dye, squalium type dye, oxobenzanthrathene type dye, fluoresceine type dye, rhodamine type dye, pyrilium type dye, perillene type dye, stilbene type dye, polythiophene type dye or rare earth complex type fluorescent substances.

A typical example of the latter (a phosphorescent dopant) is preferably a complex type compound containing metal of the 8th-10th groups of the periodic table, more preferably an iridium compound and an osmium compound and most preferable among them is an iridium compound.

Specifically, listed are compounds described in the following patent publication:

Such as WO 00/70655 pamphlet, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645 pamphlet, JP-A Nos. 2002-332291, 2002-50484, 2002-322292 and 2002-83684, Japanese Translation of PCT International Application Publication No. 2002-540572, JP-A Nos. 2002-117978, 2002-338588, 2002-170684 and 2002-352960, WO 01/93642 pamphlet, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

A part of examples thereof will be shown below.

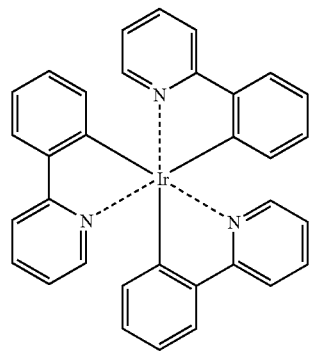

Ir-1

-continued
Ir-2
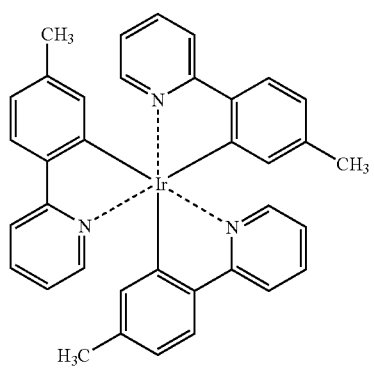
Ir-3
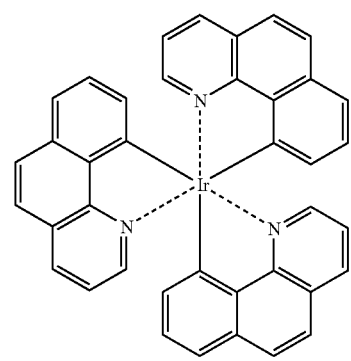
Ir-4
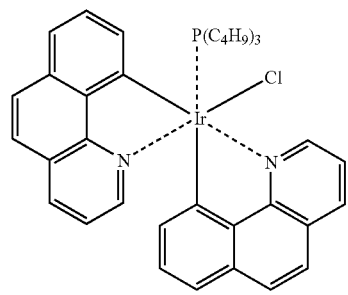
Ir-5
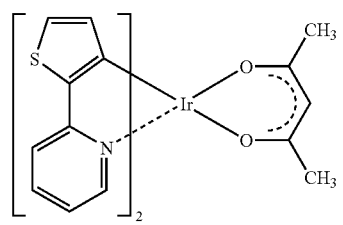
Ir-6
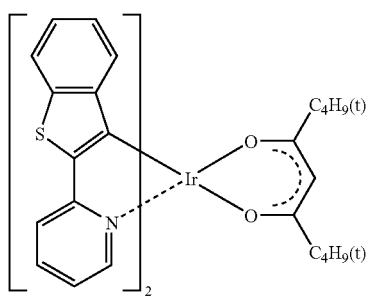
-continued
Ir-7
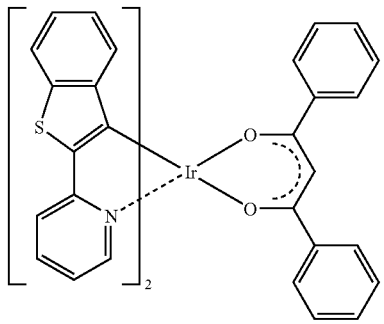
Ir-8
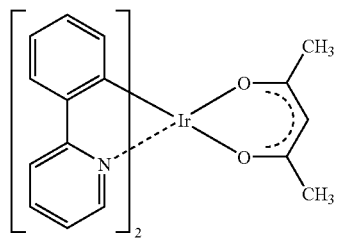
Ir-9
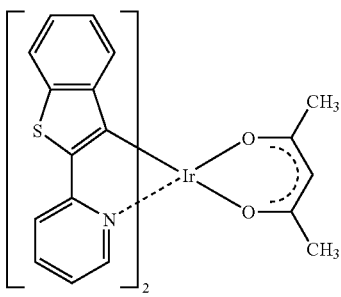
Ir-10
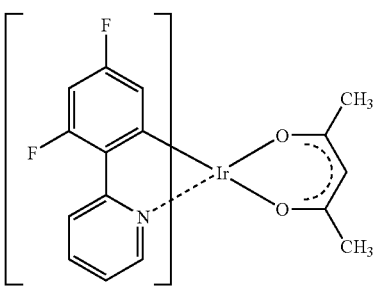
Ir-11
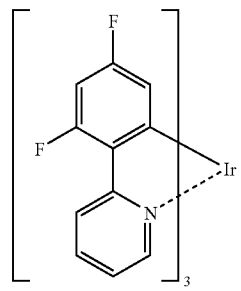

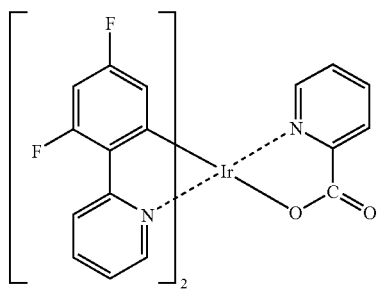
Ir-12

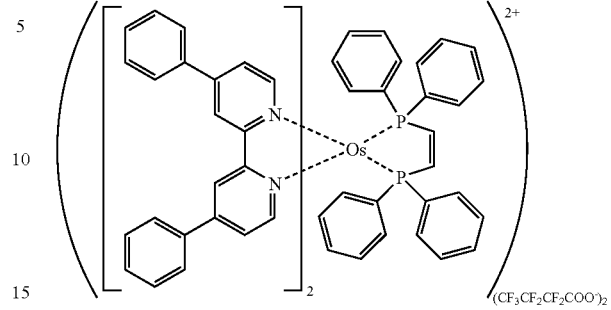
A-1

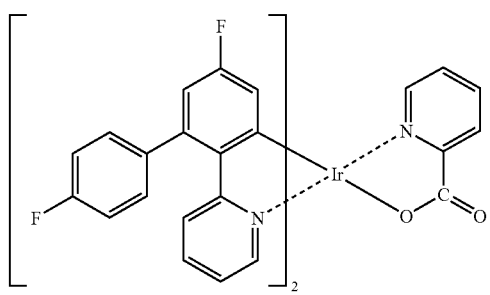
Ir-13

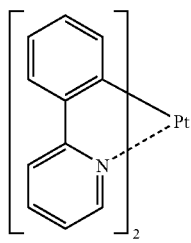
Pt-1

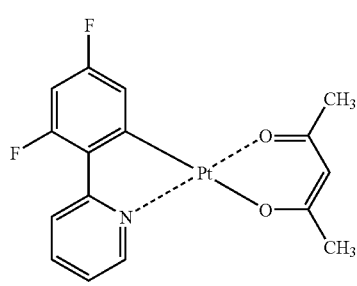
Pt-2

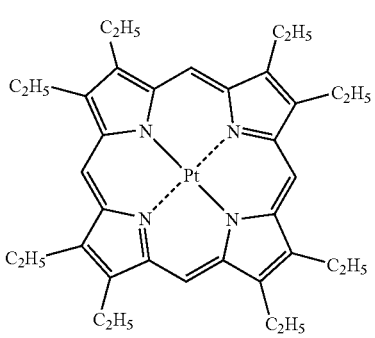
Pt-3

(Emission Host)

An emission host (also simply referred to as a host) means a compound having the largest mixing ratio (weight) in an emission layer comprised of at least two types of compounds, and other compounds are called as a dopant compound (also simply referred to as a dopant). For example, when an emission layer is comprised of two types of compounds, which are compound A and compound B, and the mixing ratio is A/B=10/90, compound A is a dopant compound and compound B is a host compound. Further, when an emission layer is comprised of three types of compounds, which are compound A, compound B and compound C, and the mixing ratio is A/B/C=5/10/85, compound A and compound B are dopant compounds and compound C is a host compound.

An emission host utilized in this invention is preferably a compound having a phosphorescence 0-0 band of a wavelength not longer than that of an emission dopant utilized in combination, and when a compound having a blue emission component of a phosphorescence 0-0 band of not longer than 480 nm is utilized as an emission dopant, an emission host is preferably provided with a phosphorescence 0-0 band of not longer than 450 nm.

An emission host of this invention is not specifically limited with respect to the structure; however, a preferable compound includes typically a compound provided with a basic skeleton such as a carbazole derivative, a triarylamine derivative, an aromatic borane derivative, a nitrogen-containing heterocyclic derivative, a thiophene derivative, a furan derivative and an oligoallylene compound, and having the aforesaid 0-0 band of not longer than 450 nm.

Further, an emission host of this invention may be either a low molecular weight compound or a polymer compound having a repeating unit, in addition to a low molecular weight compound provided with a polymerizing group such as a vinyl group and an epoxy group (an evaporation polymerizing emission host).

An emission host is preferably a compound having a positive hole transporting ability and an electron transporting ability, as well as preventing elongation of an emission wavelength and having a high Tg (a glass transition temperature).

As specific examples of an emission host, compounds described in the following Documents are preferable: For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-

280183, 2002-299060, 2002-302516, 2002-305083, 2002-305084 and 2002-308837. Specific examples of an emission host are shown below; however, this invention is not limited thereto.
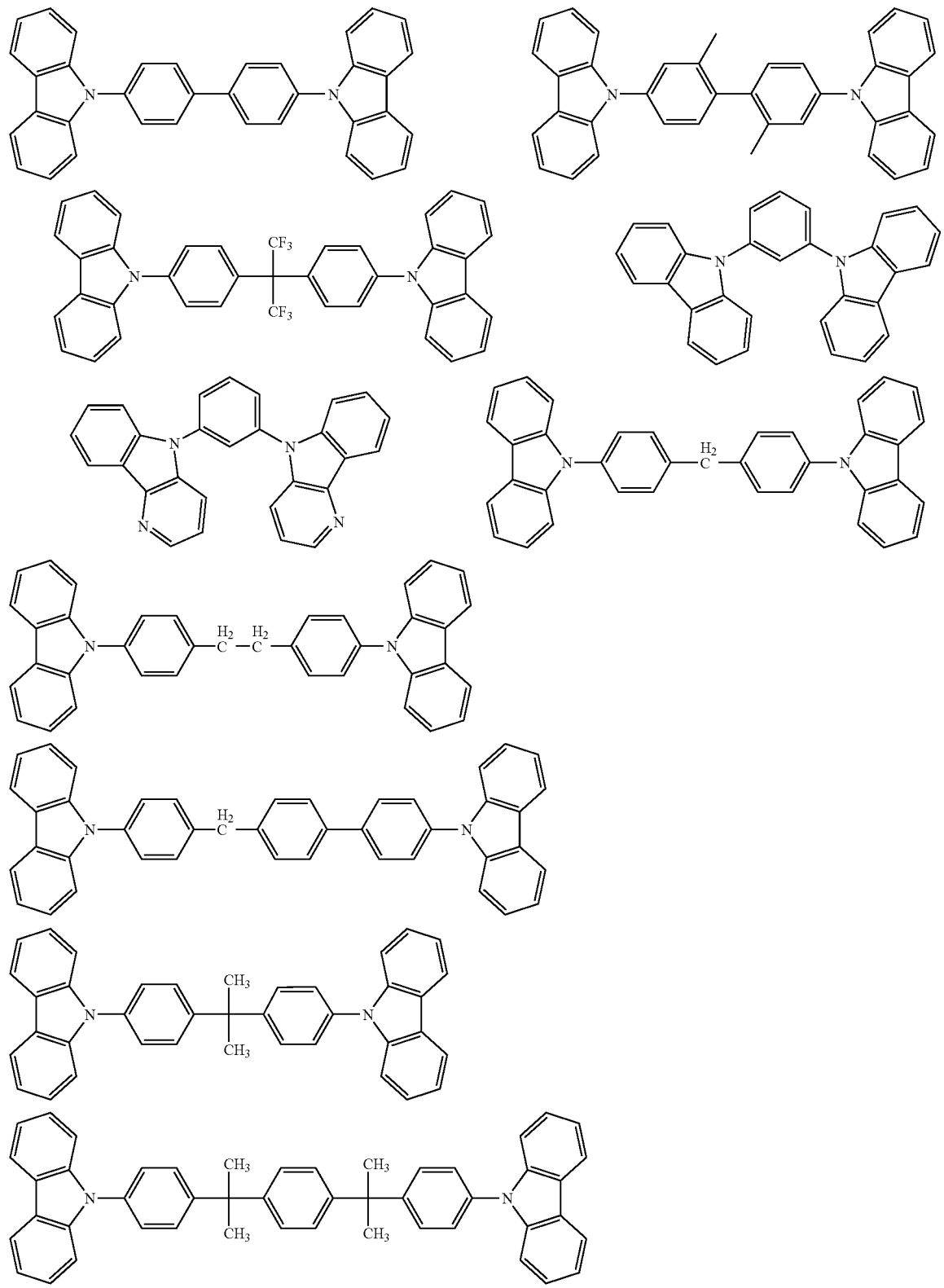

-continued
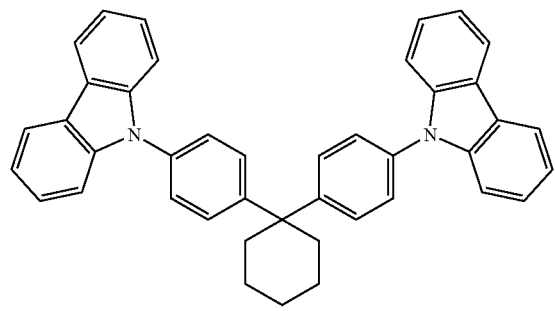
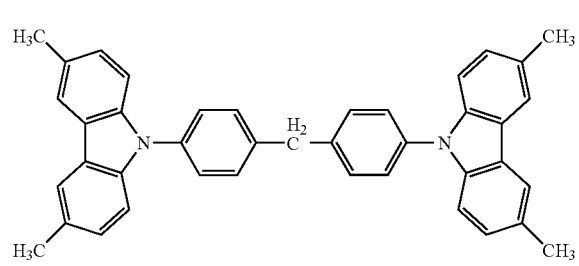
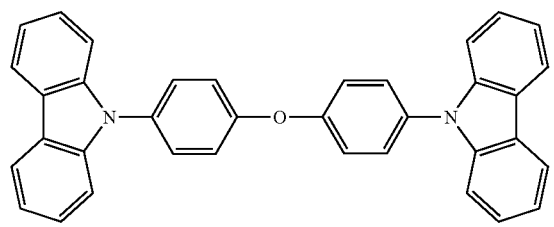
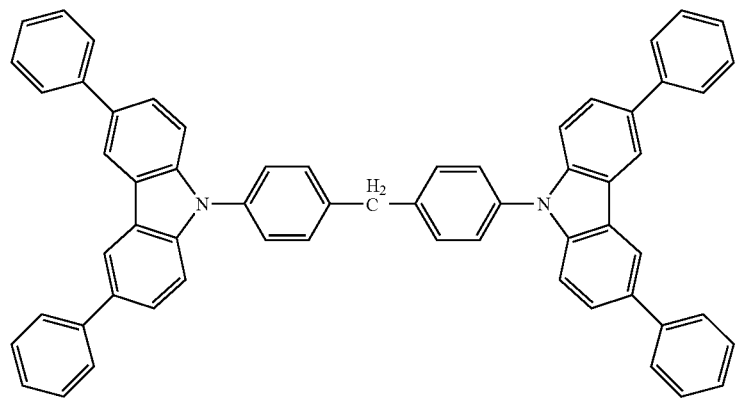
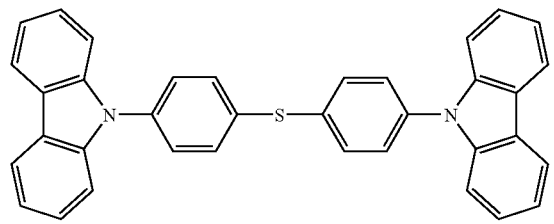
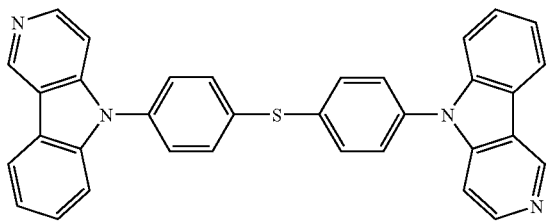
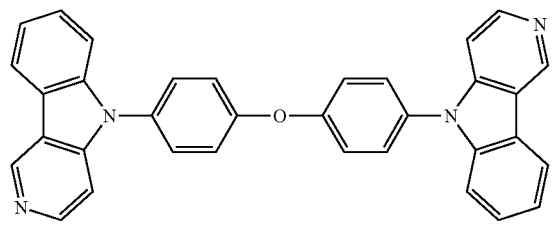

-continued
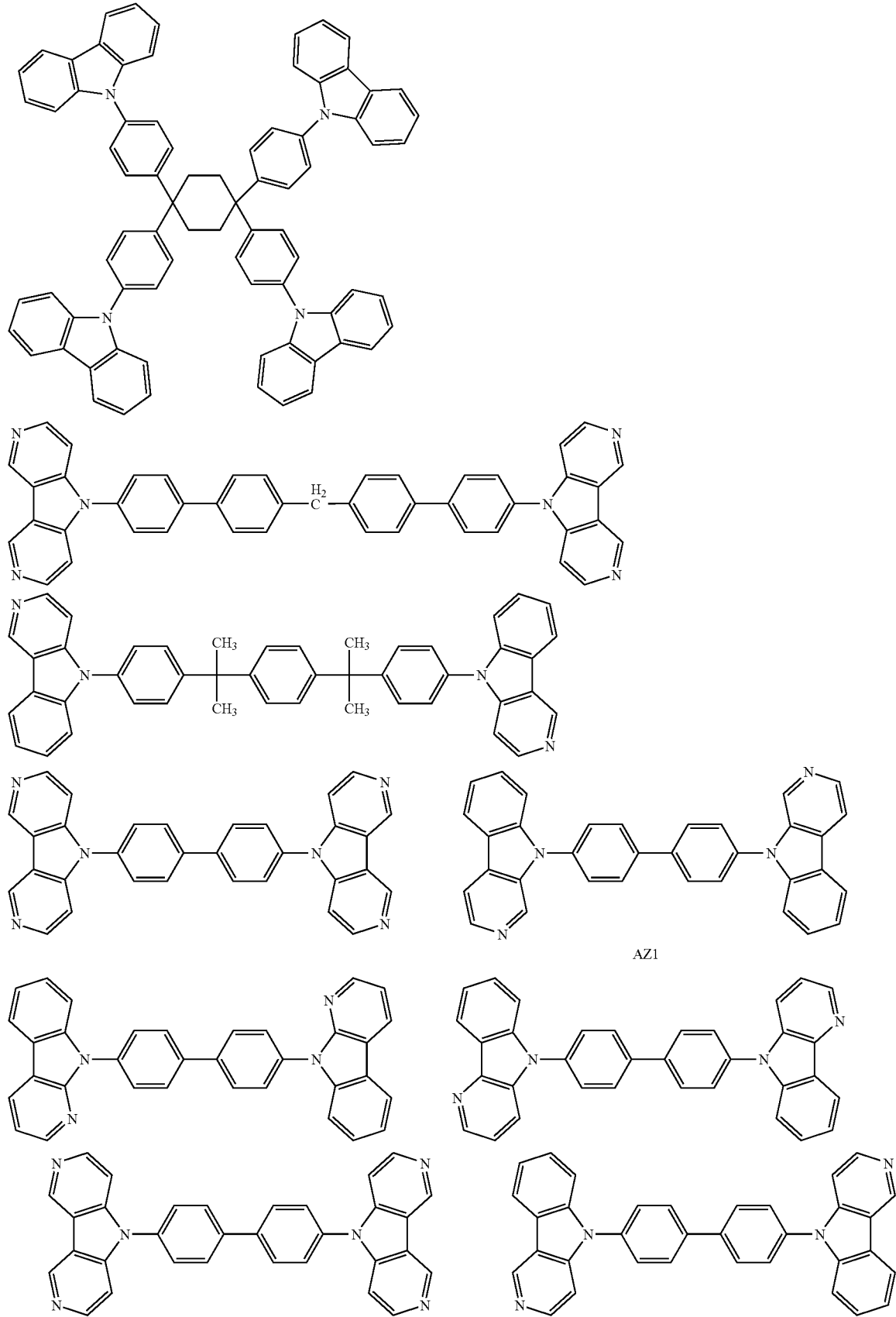
AZ1

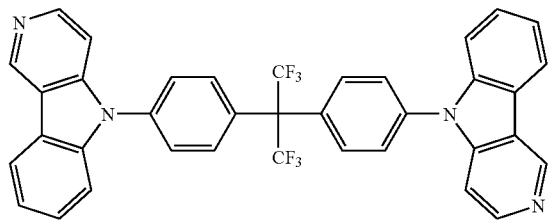
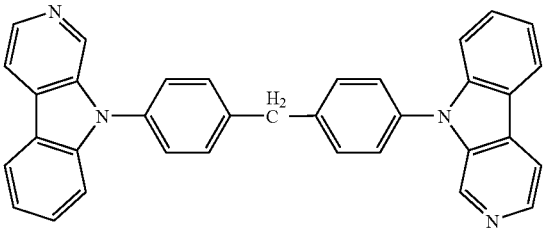
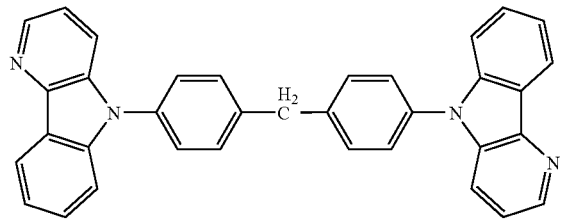

Next, a typical constitution of an organic EL element will be described.

<Constituent Layers of Organic EL Element>

Constituent layers of an organic EL element of this invention will now be explained.

Specific examples of a preferable layer constitution of an organic EL element of this invention are shown below; however, this invention is not limited thereto. (i) anode/positive hole transport layer/emission layer/positive hole inhibition layer/electron transport layer/cathode, (ii) anode/electron inhibition layer/emission layer/positive hole inhibition layer/ electron transport layer/cathode, (iii) anode/positive hole transport layer/electron inhibition layer/emission layer/positive hole inhibition layer/electron transport layer/cathode, (iv) anode/anode buffer layer/positive hole transport layer/ electron inhibition layer/emission layer/positive hole inhibition layer/electron transport layer/cathode, (v) anode/positive hole transport layer/electron inhibition layer/emission layer/ positive hole inhibition layer/electron transport layer/cathode buffer layer/cathode, (vi) anode/anode buffer layer/positive hole transport layer/electron inhibition layer/emission layer/ positive hole inhibition layer/electron transport layer/cathode buffer layer/cathode, (vii) anode/anode buffer layer/positive hole transport layer/electron inhibition layer/emission layer/ positive hole inhibition layer/electron transport layer/cathode buffer layer/cathode <Inhibition Layer (Electron Inhibition Layer, Positive Hole Inhibition Layer)>

An inhibition layer (such as an electron inhibition layer, a positive hole inhibition layer) according to this invention will now be explained.

In this invention, an organic EL element material of this invention is preferably utilized in such as a positive hole inhibition layer and an electron inhibition layer, and specifically preferably in a positive hole inhibition layer.

In the case of an organic EL element material of this invention being contained in a positive hole inhibition layer and an electron inhibition layer, a metal complex according to this invention, which is described in any one of claims 1-17, may be contained in a state of 100 weight % as a layer constituent component of such as a positive hole inhibition layer and an electron inhibition layer, or may be contained by being mixed with another organic compound (such as compounds utilized in a constituent layer of an organic EL element of this invention).

The layer thickness of an inhibition layer according to this invention is preferably 3-100 nm and more preferably 5-30 nm.

<Positive Hole Inhibition Layer>

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron.

As a positive inhibition layer, for example, a positive inhibition layer described in such as JP-A Nos. 11-204258 and 11-204359 and p. 273 of "Organic EL Elements and Idustrialization Front Thereof (Nov. 30, 1998), published by N. T. S Corp.)" is applicable to a positive hole inhibition (hole block) layer according to this invention. Further, a constitution of an electron transport layer described later can be appropriately utilized as a positive hole inhibition layer according to this invention.

<Electron Inhibition Layer>

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, a constitution of a positive hole transport layer described later can be appropriately utilized as an electron inhibition layer.

Further, in this invention, it is preferable to utilize an organic EL element material of this invention described above in an adjacent layer neighboring to an emission layer, that is in a positive hole inhibition layer and an electron inhibition layer, and specifically preferably in a positive hole inhibition layer.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is not specifically limited and can be arbitrary selected from those such as generally utilized as a charge injection transporting material of a positive hole in a conventional photoconductive material and those which are well known in the art and utilized in a positive hole injection layer and a positive hole transport layer of an EL element.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a stilylanthracene derivative, a fluorenone derivative, a hydrazone derivative, a stilubene derivative, a silazane derivative, an aniline type copolymer, or conductive polymer oligomer and specifically preferably such as thiophene oligomer.

As a positive hole transport material, those described above can be utilized, however, it is preferable to utilized a poluphlin compound, an aromatic tertiary amine compound and a stirylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N, N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4', 4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material. Further, a positive hole transport material preferably has a high Tg.

This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, is generally 5-5,000 nm. This positive transport layer may have a single layer structure comprised of one or not less than two types of the above described materials.

<Electron Transport Layer>

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

Conventionally, as an electron transfer material utilized in a single layer of an electron transfer layer, and in an electron transfer layer adjacent to the cathode side against an emission layer in the case of utilizing plural electron transfer layers, the following materials are known.

Further, an electron transfer layer is provided with a function to transmit an electron injected from a cathode to an emission layer, and compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material.

Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyradine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5-5,000 nm. This electron transport layer may have a single layer structure comprised of one or not less than two types of the above described materials.

Next, an injection layer which is known as a constituent layer of an organic EL element of this invention will be explained.

<Injection Layer>: Electron Injection Layer, Positive Hole Injection Layer

An injection layer is appropriately provided and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide.

The above-described buffer layer (injection layer) is preferably a very thin layer, and the layer thickness is preferably in a range of 0.1-100 nm although it depends on a raw material.

This injection layer can be prepared by forming a thin layer made of the above-described material according to a method well known in the art such as a vacuum evaporation method, a spin coating method, a cast method, an inkjet method and a LB method. The layer thickness of an injection layer is not specifically limited; however, is generally 5-5,000 nm. This injection layer may have a single layer structure comprised of one or not less than two types of the above described materials.

<Anode>

As an anode according to an organic EL element of this invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. When emission is taken out of this anode, the transmittance is preferably set to not less than 10% and the sheet resistance as an anode is preferably not more than a few hundreds $\Omega/\square$. Further, although the layer thickness depends on a material, it is generally selected in a range of 10-1,000 nm and preferably of 10-200 nm.

<Cathode>

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. Further, the sheet resistance as a cathode is preferably not more than a few hundreds $\Omega/\square$ and the layer thickness is generally selected in a range of 10-1,000 nm and preferably of 10-200 nm. Herein, to transmit emission, either one of an anode or a cathode of an organic EL element is preferably transparent or translucent to improve the mission luminance.

<Substrate (also referred to as Base Plate, Base Material or Support)>

A substrate according to an organic EL element of this invention is not specifically limited with respect to types of such as glass and plastics provided being transparent, however, a substrate preferably utilized includes such as glass, quartz and transparent resin film. A specifically preferable substrate is resin film capable of providing an organic EL element with a flexible property.

Resin film includes such as film comprised of polyethylene terephthalate (PET), polyethylene naphthalate (PEN), polyether sulphone (PES), polyether imide, polyether etherketone, polyphenylene sulfide, polyallylate, polyimide, polycarbonate (PC) and cellulose acetate propionate (CAP).

On the surface of resin film, an inorganic or organic cover layer or a hybrid cover layer comprising the both may be formed, and the film is preferably provided with a high barrier ability having a vapor transmittance of not more than 0.01 g/m²·day·atm.

The taking out efficiency of emission of an organic EL element of this invention at room temperature is preferably not less than 1% and more preferably not less than 2%. Herein, taking out quantum efficiency (%)=photon number emitted out of organic EL element/electron number flown into organic EL element×100.

Further, a hue improving filter such as a color filter may be utilized in combination.

In the case of an illumination application, roughening processed film (such as anti-glare film) can be also utilized in combination to decrease emission unevenness.

In the case of an application as a multi-color display device, the display is comprised of at least two types of organic EL elements having different emission maximum wavelengths, and a preferable example to prepare an organic EL element will now be explained.

<Preparation Method of Organic EL Element>

As an example of a preparation method of an organic EL element of this invention, a preparation method of an organic EL element, comprising anode/positive hole injection layer/ positive hole transport layer/emission layer/positive hole inhibition layer/electron transport layer/cathode buffer layer/cathode, will be explained.

First, on an appropriate substrate, a thin layer comprising a desired electrode substance such as an anode electrode substance is formed by means of evaporation or spattering so as to make a layer thickness of not more than 1 μm and preferably of 10-200 nm, whereby an anode is prepared. Next, on this layer, thin layers containing organic substances of such as a positive hole injection layer, a positive hole transport layer, an emission layer, a positive hole inhibition layer and an electron transport layer are formed.

A thin layer forming method of these layers containing the organic substances includes such as a spin coat method, a cast method, an inkjet method, an evaporation method and a printing method as described before, however, a vacuum evaporation method or a spin coat method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 1 nm-5 μm as a layer thickness.

After formation of these layers, a thin layer comprising a cathode electrode substance is formed thereon by means of such as evaporation or spattering so as to make a layer thickness in a range of 50-200 nm to provide a cathode, whereby a desired organic EL element can be prepared. This preparation of an organic EL element is preferably carried out with one time evacuation to prepare all through from a positive hole injection layer to a cathode, however, different layer forming method may be also applied by taking out the element on the way. At that time, consideration is necessary such as to perform the operation under a dry inert gas environment.

<Display Device>

A display device of this invention will now be explained.

A display device of this invention may be either monochromatic or multi-colored. Here explained will be a multicolor display device. In the case of a multicolor display device, a shadow mask is provided only at the time of emission layer formation, and layers can be formed all over the surface by such as an evaporation method, a cast method, a spin coat method, an inkjet method and a printing method.

When patterning is performed only with an emission layer, the method is not specifically limited; however, preferable are an evaporation method, an inkjet method and a printing method. And patterning employing a shadow mask is preferred in the case of an evaporation method.

Further, reversing the preparation order, it is also possible to prepare layers in the order of a cathode, an electron transport layer, a positive hole inhibition layer, an emission layer, a positive hole transport layer and an anode.

When a direct current voltage is applied on the multicolor display device thus prepared, emission can be observed by application of a voltage of approximately 2-40 V setting an anode to + polarity and a cathode to − polarity. Further, no current flows and no emission generate at all even when a voltage is applied with a reversed polarity. Further, in the case of alternate current voltage being applied, emission generates only in a state of an anode being + and a cathode being −. Herein, the wave shape of alternate current may be arbitrary.

A multicolor display device can be utilized as a display device, a display and various types of emission light sources. In a display device and a display, full-colored display is possible by employing three types of organic EL elements providing blue, red and green emissions.

A display device and a display include a TV, a personal computer, a mobile instrument, an AV instrument, a character broadcast display and an information display in a car. Particularly, the display device and the display may be also utilized as a display to playback still images and moving images, and may adopt either a simple matrix (a passive matrix) mode or an active matrix mode when being utilized as a display device for moving image playback.

An illumination light source includes a home use illumination, a car room illumination, a backlight of a watch or a liquid crystal, a panel advertisement, a signal, a light source of an optical memory medium, a light source for an electrophotographic copier, a light source for an optical telecommunication processor and a light source for a photo-sensor, however, is not limited thereto.

<Illumination Device>

Illumination device of this invention will now be explained.

An organic EL element of this invention can be utilized as an organic EL element provided with a resonator structure, and a utilization purpose of such an organic EL element provided with a resonator structure includes such as a light source for an optical memory medium, a light source for an electrophotographic copier, a light source for a optical telecommunication processor and a light source for a photo-sensor, however, is not limited thereto. Further, the organic EL element may be utilized for the above-described applications by being made to perform laser emission.

Further, an organic EL element of this invention may be utilized as one type of a lamp like an illumination and an exposure light, and may be also utilized as a display device of a projector of an image projecting type and a display device (a display) of a type to directly view still images and moving images. An operating mode in the case of being utilized as a display device for playback of moving images may be either a simple matrix (a passive matrix) mode or an active matrix mode. In addition, a full-color display device can be prepared by utilizing at least two types of organic EL elements of this invention which emit different emitting colors.

In the following, one example of a display device provided with an organic EL element of this invention will be explained.

FIG. 1 is a schematic drawing to show an example of a display device constituted of an organic EL element. It is a schematic drawing of a display, which displays image information by emission of an organic EL element, such as a mobile phone.

Display 1 is constituted of such as display section A having plural number of pixels and control section B which performs image scanning of display section A based on image information.

Control section B, which is electrically connected to display section A, sends a scanning signal and an image data signal to plural number of pixels based on image information from the outside and pixels of each scanning line successively emit depending on the image data signal by a scanning signal to perform image scanning, whereby image information is displayed on display section A.

Figure 2:
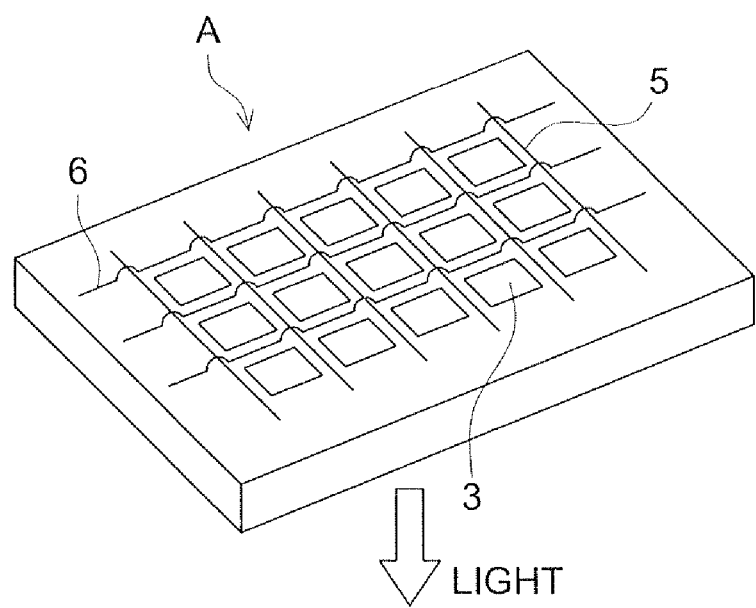
FIG. 2 is a schematic drawing of display section A.

FIG. 2 is a schematic drawing of display section A.

Display section A is provided with such as a wiring part, which contains plural scanning lines 5 and data lines 6, and plural pixels 3 on a substrate. Primary part materials of display section A will be explained in the following.

In the drawing, shown is the case that light emitted by pixel 3 is taken out along the white allow (downward).

Scanning lines 5 and plural data lines 6 in a wiring part each are comprised of a conductive material, and scanning lines 5 and data lines 6 are perpendicular in a grid form and are connected to pixels 3 at the right-angled crossing points (details are not shown in the drawing).

Pixel 3 receives an image data from data line 6 when a scanning signal is applied from scanning line 5 and emits according to the received image data. Full-color display device is possible by appropriately arranging pixels having an emission color in a red region, pixels in a green region and pixels in a blue region, side by side on the same substrate.

Next an emission process of a pixel will be explained.

Figure 3:
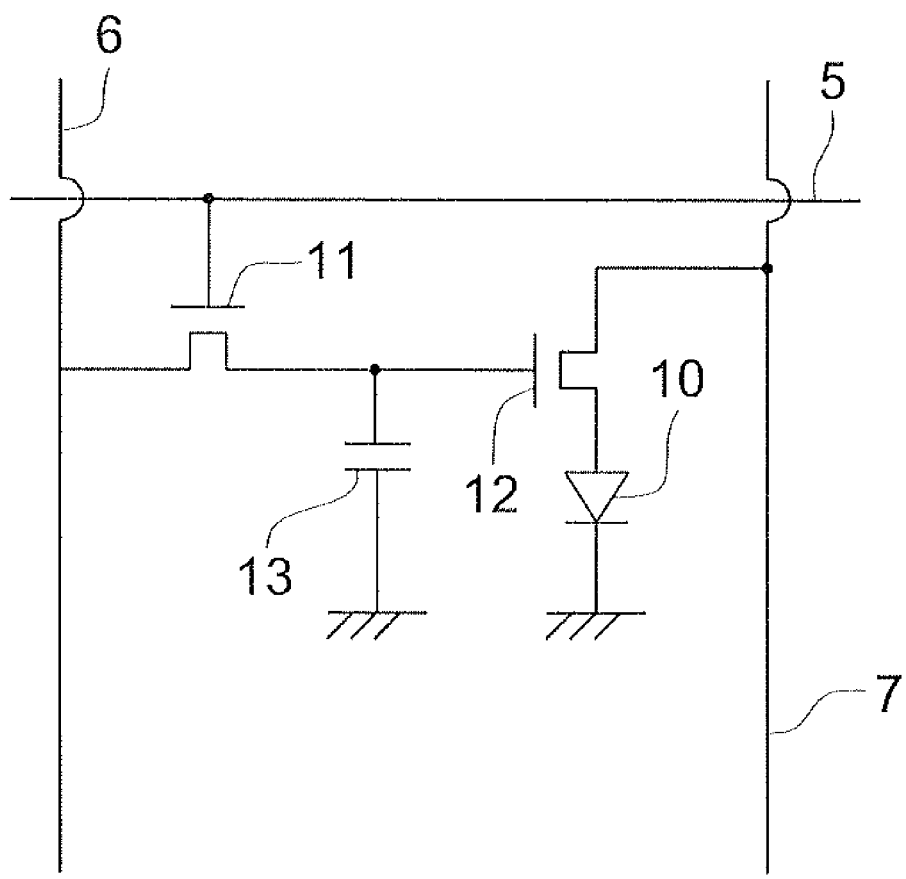
FIG. 3 is an equivalent circuit diagram of an operation circuit constituting an image pixel.

FIG. 3 is a schematic drawing of a pixel.

A pixel is equipped with such as organic EL element 10, switching transistor 11, operating transistor 12 and condenser 13. Red, green and blue emitting organic EL elements are utilized as organic EL element 10 for plural pixels, and full-color display device is possible by arranging these side by side on the same substrate.

In FIG. 3, an image data signal is applied on the drain of switching transistor 11 via data line 6 from control section B. Then, when a scanning signal is applied on the gate of switching transistor 11 via scanning line 5 from control section B, operation of switching transistor is on to transmit the image data signal applied on the drain to the gates of condenser 13 and operating transistor 12.

Operating transistor 12 is on, simultaneously with condenser 13 being charged depending on the potential of an image data signal, by transmission of an image data signal. In operating transistor 12, the drain is connected to electric source line 7 and the source is connected to the electrode of organic EL element 10, and an electric current is supplied from electric source line 7 to organic EL element 10 depending on the potential of an image data applied on the gate.

When a scanning signal is transferred to next scanning line 5 by successive scanning of control section B, operation of switching transistor 11 is off. However, since condenser 13 keeps the charged potential of an image data signal even when operation of switching transistor 11 is off, operation of operating transistor 12 is kept on to continue emission of organic EL element 10 until the next scanning signal is applied. When the next scanning signal is applied by successive scanning, operating transistor 12 operates depending on the potential of an image data signal synchronized to the scanning signal and organic EL element 10 emits.

That is, emission of each organic EL element 10 of plural pixels 3 is performed by providing switching transistor 11 and operating transistor 12 against each organic EL element 10 of plural pixels 3. Such an emission method is called as an active matrix mode.

Herein, emission of organic EL element 10 may be either emission of plural gradations based on a multiple-valued image data signal having plural number of gradation potentials or on and off of a predetermined emission quantity based on a binary image data signal.

Further, potential hold of condenser 13 may be either continuously maintained until the next scanning signal application or discharged immediately before the next scanning signal application.

In this invention, emission operation is not necessarily limited to the above-described active matrix mode but may be a passive matrix mode in which organic EL element is emitted based on a data signal only when a scanning signal is scanned.

Figure 4:
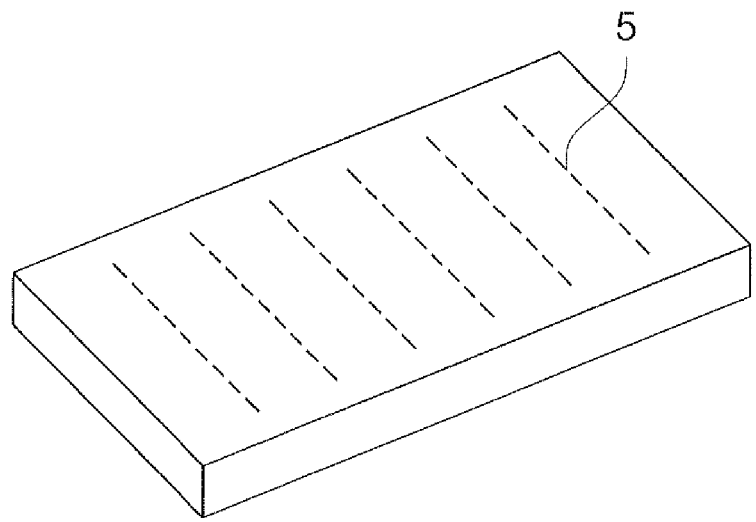
FIG. 4 is a schematic drawing of a display device according to a passive matrix mode.
Figure 4:
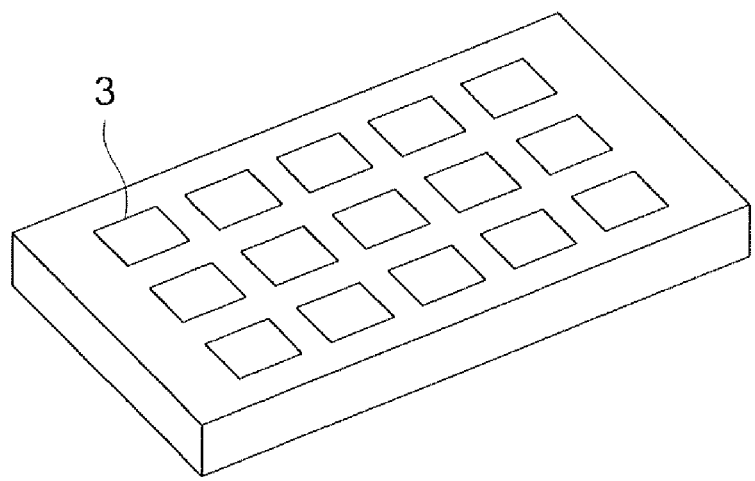
Figure 4:
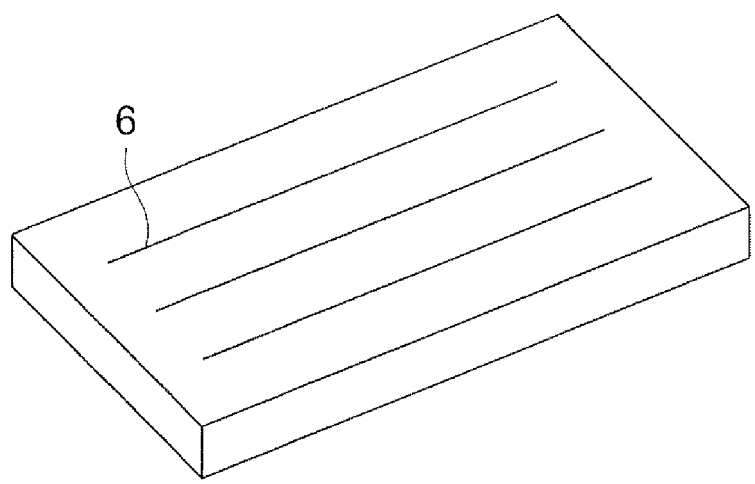

FIG. 4 is a schematic drawing of a display device based on a passive matrix mode. In FIG. 4, plural number of scanning lines 5 and plural number of image data lines 6 are arranged grid-wise, opposing to each other and sandwiching pixels 3.

When a scanning signal of scanning line 5 is applied by successive scanning, pixel 3 connected to scanning line 5 applied with said signal emits depending on an image data signal.

Since pixel 3 is provided with no active element in a passive matrix mode, decrease of manufacturing cost is possible.

An organic EL element material of this invention can be also applied to an organic EL element to generate emission of practically white color as an illumination device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic electroluminescence element according to this invention, it is enough only to mix plural emission dopants in combination. A mask is provided only at the time of forming such as an emission layer, a positive hole transport layer or an electron transport layer, to only simply arrange the plural emission dopants such as by separately painting through the mask, while other layers are commonly utilized to require no patterning such as a mask. Therefore, such as an electrode can be formed all over the plane by such as an evaporation method, a cast method, a spin coat method, an inkjet method and a printing method, resulting in improvement of productivity. According to this method, different from a white organic EL device in which plural colors of emission elements are arranged parallel in an alley form, an element itself is white emitting.

An emission material utilized in an emission layer is not specifically limited, and in the case of a backlight of a liquid crystal display element, any combination by arbitrary selection among platinum complexes according to this invention or emission materials well known in the art can be utilized so as to be fitted to the wavelength range corresponding to CF (color filter) characteristics, whereby white emission can be obtained.

In this manner, a white emitting organic EL element of this invention is usefully utilized as one type of a lamp such as a home use illumination, a car room illumination or an exposure light source as various emission light sources or illumination devices, in addition to the aforesaid display device and a display, and is further usefully applied for a display as such as a backlight of a liquid crystal display.

In addition to these, listed is a wide range of applications such as a backlight of a watch, an advertising board, a signal, a light source of an optical memory medium, a light source of an electrophotographic copier, a light source of an optical telecommunication processor and a light source of an optical sensor, and further general home us electric instruments which require a display device.

EXAMPLE

In the following, this invention will be explained with reference to examples, however, is not limited thereto.

In the following, such as emission host materials, emission dopants and materials employed in formation of a positive hole inhibition layer, which are utilized in any one of Examples 1-6, will be shown.

α-NPD

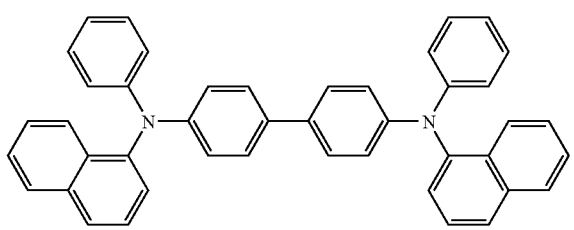

BCP

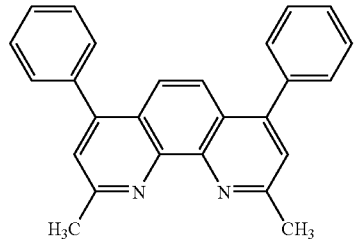

Alq₃

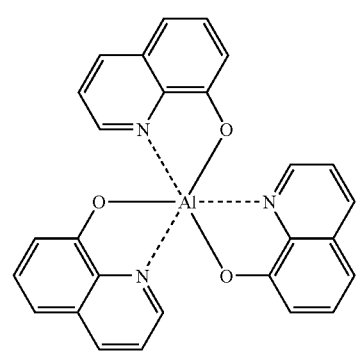

CBP

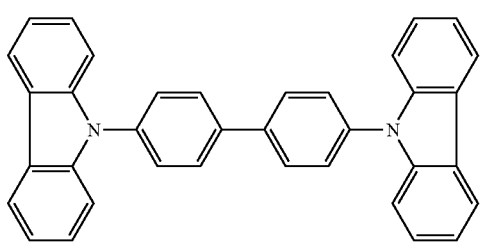

-continued

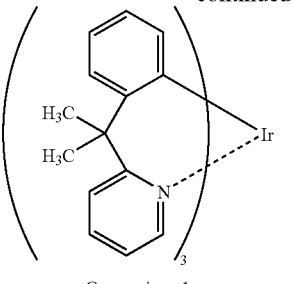

Comparison 1

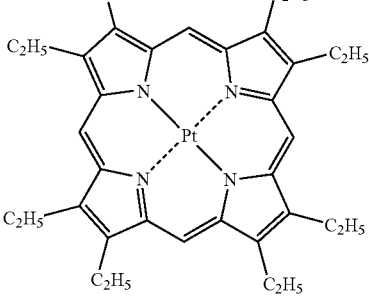

Comparison 2

Comparison 3

Example 1

Preparation of Organic EL Element OLED-1

After a substrate, in which ITO had been deposited at 150 nm on a glass plate as an anode, was subjected to patterning, the transparent support substrate was washed with isopropyl alcohol by use of ultrasonic waves, followed by being dried with a dry nitrogen gas, and was subjected to UV ozone washing for 5 minutes.

This transparent support substrate was fixed on a substrate holder of a vacuum evaporation system available on the market, and on the other hand, each of five resistance heating boats made of tantalum was charged with α-NPD, CBP, Ir-10, BCP and Alq$_3$, respectively, which was attached in the vacuum evaporation system (in the first vacuum chamber).

Further, a resistance heating boat made of tantalum was charged with lithium fluoride and a resistance heating boat made of tungsten was charged with aluminum, respectively, and these boats were attached in the second chamber of the vacuum evaporation system.

First, after the first vacuum chamber was evacuated down to $4 \times 10^{-4}$ Pa, the aforesaid heating boat charged with α-NPD was heated with an electric current to deposit α-NPD on a support substrate at a deposition rate of 0.1-0.2 nm/sec so as to make a layer thickness of 25 nm, whereby a positive hole injection/transport layer was formed.

Further, the aforesaid heating boat charged with CBP and the boat charged with Ir-10 were independently supplied with an electric current to deposit CBP as an emission host and Ir-10 as an emission dopant so as to make a layer thickness of 30 nm while adjusting the deposition rates thereof to 100/7, whereby an emission layer was formed.

Next, the aforesaid heating boat charged with BCP was heated with an electric current to provide a positive hole inhibition layer having a layer thickness of 10 nm at a deposition rate of 0.1-0.2 nm/sec. Further, the aforesaid heating boat charged with Alq$_3$ was heated with an electric current to provide an electron transport layer having a layer thickness of 40 nm at a deposition rate of 0.1-0.2 nm/sec.

Next, after an element having been deposited with up to an electron injection layer as described before was transferred into the second vacuum chamber while keeping vacuum, a mask, which was made of stainless steel and had rectangular holes, was arranged on the electron injection layer by means of remote control from outside of the system.

Figure 5:
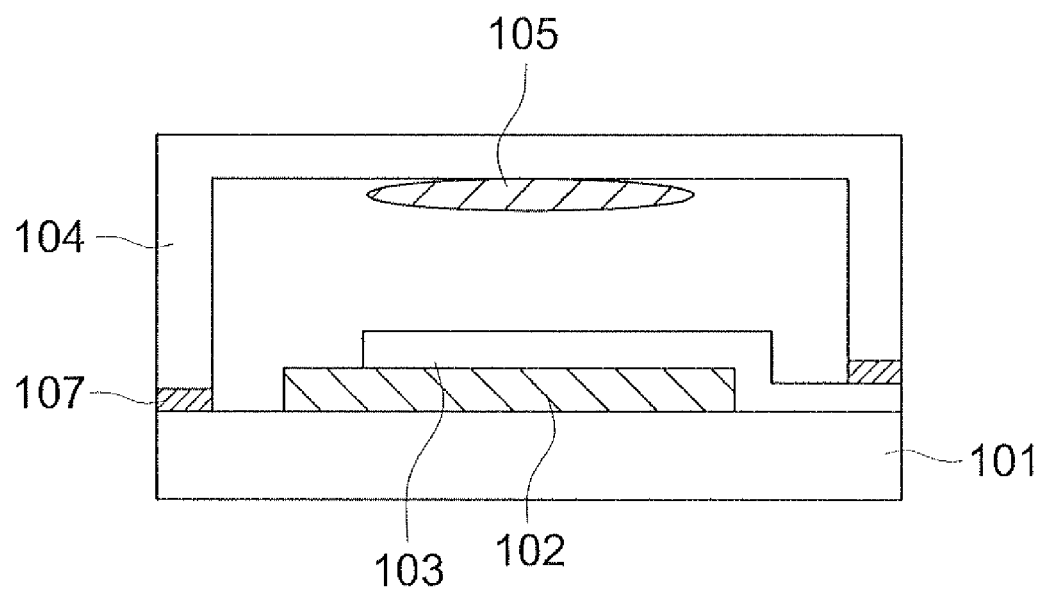
FIG. 5 is a brief schematic drawing of a sealing structure of organic EL element OLED 1-1.

After the second vacuum chamber was evacuated down to $2\times10^{-4}$ Pa, a boat charged with lithium fluoride was supplied with an electric current to provide a cathode buffer layer having a layer thickness of 0.5 nm at a deposition rate of 0.01-0.02 nm/sec, and then a boat charged with aluminum was supplied with an electric current to provide a cathode having a layer thickness of 150 nm at a deposition rate of 1-2 nm/sec. Further, this organic EL element was transferred into a glove box under a nitrogen atmosphere (a glove box substituted with a nitrogen gas having a high purity of not less than 99.99%) without contacting with the air, and was made into a sealed structure the interior of which is substituted with nitrogen as shown in FIG. 5 to prepare OLED 1-1. Herein, as barium oxide 105, which is a water capturing agent, utilized was high purity barium oxide powder manufactured by Aldrich Corp., which had been pasted in glass sealing can 104 by use of fluorine-containing resin semi-permeable membrane attached with an adhesive (Microtex S-NTF8031Q, manufactured by Nitto Denko Corp.) and prepared in advance. For adhesion of a sealing can and an organic EL element, ultraviolet ray curable adhesive 107 was utilized, and the both were adhered with irradiation of ultraviolet rays, whereby a sealed element was prepared. In FIG. 5, 101 is a glass substrate provided with a transparent electrode; 102 is the aforesaid organic EL layer comprising such as a positive hole injection/transport layer, an emission layer and a positive hole inhibition layer and an electron transport layer; and 103 is a cathode.

Preparation of Organic EL Elements OLED 1-2-1-17

Organic EL elements OLED 1-2-1-17 each were prepared in a similar manner to preparation of organic EL element OLED 1-1 described above, except that an emission dopant was changed as shown in table 1.

Preparation of Organic EL Elements OLED 1-18

Organic EL element OLED 1-18 was prepared in a similar manner to preparation of organic EL element OLED 1-1, except that an emission host was changed to AZ1 from CBP and metal complexes of this invention (shown in the table by compound No.) were utilized as an emission dopant.

The following evaluations were made with respect to prepared organic EL elements OLED 1-1-1-18.

<Quantum Efficiency of Taking Out>

Each of organic EL elements OLED 1-1-1-18 was lighted under a constant current condition of 2.5 mA/cm$^2$ at room temperature (approximately 23-25° C.), and an emission luminance (L) [cd/m$^2$] immediately after turning on was measured, whereby a quantum efficiency of taking out ($\eta$) was calculated. Herein, CS-1000 (produced by Minolta Co., Ltd.) was utilized for measurement of emission luminance.

Further, each of the quantum efficiency of taking out was expressed as a relative value when that of organic EL element OLED 1-1 was set to 100.

<Emission Life>

Each of organic EL elements OLED 1-1-1-18 was continuously lighted under a constant current condition of 2.5 mA/cm$^2$ at room temperature (approximately 23-25° C.), and time to reach a half of the initial luminance ($\tau 1/2$) was measured. Further, each emission life was expressed as a relative value when that of organic EL element OLED 1-1 was set to 100.

The obtained results are shown in table 1.

TABLE 1

| Element No. | Emission dopant | Quantum efficiency of taking out | Emission life | Remarks |
| --- | --- | --- | --- | --- |
| OLED 1-1 | Ir-10 | 100 | 100 | Comparison |
| OLED 1-2 | Ir-12 | 98 | 87 | Comparison |
| OLED 1-3 | Comparison 1 | 99 | 80 | Comparison |
| OLED 1-4 | Comparison 2 | 97 | 75 | Comparison |
| OLED 1-5 | I-4 | 119 | 180 | Invention |
| OLED 1-6 | I-6 | 117 | 215 | Invention |
| OLED 1-7 | I-36 | 128 | 177 | Invention |
| OLED 1-8 | I-41 | 123 | 168 | Invention |
| OLED 1-9 | I-67 | 118 | 177 | Invention |
| OLED 1-13 | P-4 | 118 | 177 | Invention |
| OLED 1-14 | P-6 | 117 | 212 | Invention |
| OLED 1-15 | P-13 | 121 | 170 | Invention |
| OLED 1-16 | P-35 | 119 | 166 | Invention |
| OLED 1-17 | P-42 | 119 | 159 | Invention |
| OLED 1-18 | I-68 | 129 | 220 | Invention |

It is clear from table 1 that organic EL elements prepared by employing a metal complex according to this invention as an organic EL element material can achieve high emission efficiency and longer emission life, compared to the comparative elements. Herein, all emission colors of elements of this invention were blue.

Example 2

Preparation of Organic EL Elements OLED 2-1-2-17

Organic EL elements OLED 2-1-2-17 were prepared in a similar manner to example 1, except that an emission dopant was changed as described in table 2.

Preparation of Organic EL Elements OLED 2-18

Organic EL element OLED 2-18 was prepared in a similar manner to preparation of organic EL element OLED 2-1, except that an emission host was changed to AZ1 from CBP and metal complexes of this invention (shown in the table by compound No.) were utilized as an emission dopant.

Measurement of a quantum efficiency of taking out and an emission life of each prepared element was performed in a similar manner to a method described in example 1.

At this time, any value of each organic EL element sample was expressed as a relative value when the value of OLED 2-1 was set to 100. The obtained results are shown in table 2.

TABLE 2

| Element No. | Emission dopant | Quantum efficiency of taking out | Emission life | Remarks |
| --- | --- | --- | --- | --- |
| OLED 2-1 | Ir-1 | 100 | 100 | Comparison |
| OLED 2-2 | I-1 | 112 | 180 | Invention |
| OLED 2-3 | I-8 | 115 | 160 | Invention |
| OLED 2-4 | I-47 | 110 | 155 | Invention |
| OLED 2-5 | I-48 | 112 | 146 | Invention |
| OLED 2-6 | I-50 | 109 | 135 | Invention |
| OLED 2-7 | I-51 | 110 | 139 | Invention |
| OLED 2-8 | I-61 | 110 | 142 | Invention |
| OLED 2-9 | I-69 | 109 | 140 | Invention |
| OLED 2-10 | P-1 | 111 | 176 | Invention |
| OLED 2-11 | P-7 | 114 | 163 | Invention |
| OLED 2-12 | P-45 | 110 | 145 | InventIon |
| OLED 2-13 | P-48 | 110 | 142 | Invention |
| OLED 2-14 | P-5O | 109 | 133 | Invention |
| OLED 2-15 | P-51 | 110 | 142 | Invention |
| OLED 2-16 | P-61 | 110 | 138 | Invention |
| OLED 2-17 | P-66 | 109 | 130 | Invention |
| OLED 2-18 | I-61 | 116 | 181 | Invention |

It is clear from table 2 that organic EL elements prepared by employing an organic EL element material of this invention as an emission dopant can achieve high emission efficiency and long emission life, compared to the comparative elements. Herein, all emission colors of elements of this invention were green.

Example 3

Preparation of Organic EL Elements OLED 3-1-3-9

Organic EL elements OLED 3-1-3-9 were prepared in a similar manner to example 1, except that an emission dopant was changed as described in table 3.

Preparation of Organic EL Element OLED 3-10

Organic EL element OLED 3-10 was prepared in a similar manner to preparation of organic EL element OLED 3-1, except that an emission host was changed to AZ1 from CBP and metal complexes of this invention (shown in the table by compound No.) were utilized as an emission dopant.

Measurement of a quantum efficiency of taking out and an emission life of each prepared element were performed in a similar method as described in example 1. At this time, any value of each organic EL element sample was expressed as a relative value when the value of OLED 3-1 was set to 100. The obtained results are shown in table 3.

TABLE 3

| Element No. | Emission dopant | Quantum efficiency of taking out | Emission life | Remarks |
| --- | --- | --- | --- | --- |
| OLED 3-1 | Ir-9 | 100 | 100 | Comparison |
| OLED 3-2 | Comparison 3 | 94 | 95 | Comparison |
| OLED 3-4 | I-20 | 112 | 160 | Invention |
| OLED 3-5 | I-37 | 112 | 165 | Invention |
| OLED 3-6 | I-70 | 110 | 180 | Invention |
| OLED 3-7 | I-71 | 112 | 168 | Invention |
| OLED 3-8 | P-43 | 110 | 175 | Invention |
| OLED 3-9 | P-44 | 114 | 148 | Invention |
| OLED 3-10 | I-71 | 112 | 185 | Invention |

It is clear from table 3 that organic EL elements employing a compound of this invention as an emission dopant can achieve higher emission efficiency and long emission life, compared to the comparative element. Herein, all emission colors of elements of this invention were red.

Example 4

Preparation of Organic EL Elements OLED 4-1-4-13

Organic EL element OLED 4-1 was prepared in a similar manner to organic EL element OLED 2-1 of example 2. Successively, organic EL elements OLED 4-2-4-13 were prepared in a similar manner to organic EL element OLED 4-1, except that a positive hole inhibition material was changed as described in table 4.

Measurement of a quantum efficiency of taking out and an emission life of prepared organic EL elements OLED 4-1-4-13 were performed in a similar method as described in example 1.

The evaluation results were shown as a relative value of each organic EL element sample when the value of OLED 4-1 was set to 100. The obtained results are shown in table 4.

TABLE 4

| Element No. | Positive hole inhibition material | Quantum efficiency of taking out | Emission life | Remarks |
| --- | --- | --- | --- | --- |
| OLED 4-1 | BCP | 100 | 100 | Comparison |
| OLED 4-2 | I-2 | 114 | 155 | Invention |
| OLED 4-3 | I-4 | 114 | 143 | Invention |
| OLED 4-4 | I-10 | 116 | 140 | Invention |
| OLED 4-5 | I-14 | 115 | 130 | Invention |
| OLED 4-6 | I-41 | 113 | 130 | Invention |
| OLED 4-7 | I-61 | 110 | 135 | Invention |
| OLED 4-8 | P-2 | 113 | 150 | Invention |
| OLED 4-9 | P-9 | 115 | 137 | Invention |
| OLED 4-10 | P-4 | 113 | 142 | Invention |
| OLED 4-11 | P-15 | 115 | 134 | Invention |
| OLED 4-12 | P-42 | 112 | 123 | Invention |
| OLED 4-13 | P-61 | 109 | 129 | Invention |

It is clear from table 4 that elements of this invention can achieve higher emission efficiency and long emission life, compared to the comparative element. Herein, all emission colors of organic EL elements of this invention were green.

Example 5

Preparation of Full-Color Display Device (Preparation of Blue Emission Element)
Organic EL element OLED 1-5 of example 1 was utilized as a blue emission element.

(Preparation of Green Emission Element)
Organic EL element OLED 2-7 of Example 2 was utilized as a green emission element.

(Preparation of Red Emission Element)
Organic EL element OLED 3-6 of Example 3 was utilized as a red emission element.

Each of red, green and blue organic EL elements prepared above was arranged parallel on the same substrate to prepare an active matrix mode full-color having a form as described in FIG. 1, and only display section A of said display device is schematically shown in FIG. 2. That is, a wiring section containing plural lines of scanning line 5 and data line 6, and plural pixels 3 (such as a pixel having an emission color of a red region, a pixel of a green region and a pixel of a blue region) arranged parallel are provided on the same substrate, and scanning lines 5 and data lines 6 in a wiring section, which are comprised of a conductive material, respectively, cross each other at a right angle in a grid form to be connected to pixels 3 at the right-angled crossing points (details being not shown in the drawing). The aforesaid plural pixels 3 each are operated in an active matrix mode, in which an organic EL element, a switching transistor and an operating transistor are provided corresponding to each emission color, and receive an image data signal from data line 6 when a scanning signal is applied from scanning line 5 to emit based on the received image data. Each red, green and blue pixel was appropriately arranged parallel in this manner, whereby a full-color display device was prepared.

It has been proved that a full-color moving image display device exhibiting a high luminance, a high durability and a highly visibility can be achieved by operating said full-color display.

Example 6

Preparation of White Emitting Element and White Illumination

A transparent electrode substrate of example 1 was subjected to patterning of an electrode having an area of 20 mm×20 mm, and α-NPD was deposited thereon at a layer thickness of 25 nm as a positive hole injection/transport layer in a similar manner to example 1; and further the aforesaid heating boat charged with CBP, boat containing I-4 and boat containing Ir-9 were supplied with an electric current to deposit an emission layer having a layer thickness of 30 nm, while adjusting the evaporation rates of CBP as an emission host, Ir-4 and Ir-9 as emission dopants to be 100/5/0.6.

Successively, BCP was deposited at 10 nm to provide a positive hole inhibition layer. Further, Alq$_3$ was deposited at 40 nm to provide an electron transport layer.

Next, similar to example 1, a mask with square holes having a shape nearly same as a transparent electrode made of stainless steel was arranged on an electron injection layer, and 0.5 nm of lithium fluoride as a cathode buffer layer and 150 nm of aluminum as a cathode were deposited.

This element was equipped with a sealed can, which had a similar structure and was prepared in a similar method to example 1, to prepare a flat lamp. FIG. 6 is a schematic drawing of the flat lamp. FIG. 6(a) is a schematic plane view and FIG. 6(b) is a schematic cross-sectional view.

Nearly white light was obtained when this lamp was supplied with an electric current to prove that said lamp can be utilized as an illumination.

INDUSTRIAL APPLICATIONS OF THIS INVENTION

This invention can provide an organic electroluminescence element material, which is a metal complex having a specific ligand, and an organic EL element, an illumination and a display device, which are provided with high emission efficiency as well as long emission life. Said electroluminescence element material is characterized by containing a metal complex having a ligand represented by Formula (1).

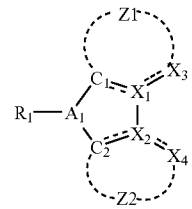

Formula (1)

The invention claimed is:

1. An organic electroluminescence element material comprising a metal complex provided with a partial structure represented by Formula (2),

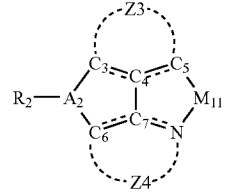

Formula (2)

wherein, $C_3$, $C_4$, $C_5$, $C_6$, and $C_7$ are each independently a carbon atom or a nitrogen atom; $Z_3$ in conjunction with $C_3$, $C_4$ and $C_5$ is an atomic group which forms an aromatic hydrocarbon ring or an aromatic heterocyclic ring; $Z_4$ in conjunction with $C_6$, $C_7$ and N is an atomic group which forms an aromatic heterocyclic ring; $A_2$ is a nitrogen atom or a boron atom; $R_2$ is a substituent group; $M_{11}$ is an element of the 8th to 10th groups of the periodic table; and a bond between $C_3$ and $C_4$, a bond between $C_4$ and $C_5$, a bond between $C_6$ and $C_7$, and a bond between $C_7$ and N, are a single bond or a double bond.

2. The organic electroluminescence element material of claim 1, wherein $R_2$ of Formula (2) is an aromatic hydrocarbon ring or an aromatic heterocyclic ring.

3. The organic electroluminescence element material of claim 1, wherein the metal complex is provided with a partial structure represented by Formula (3) or a tautomer thereof,

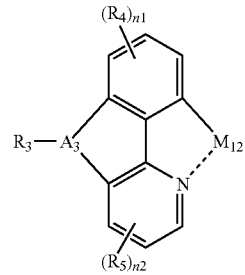

Formula (3)

wherein $A_3$ is a nitrogen atom or a boron atom, $R_3$ is a substituent group, $R_4$ and $R_5$ are substituent groups, n1 and n2 are each 0, 1 or 2, and $M_{12}$ is an element of the 8th to 10th groups of the periodic table.

4. The organic electroluminescence element material of claim 1, wherein $M_{11}$ is iridium.

5. The organic electroluminescence element material of claim 2, wherein $M_{11}$ is iridium.

6. The organic electroluminescence element material of claim 3, wherein $M_{12}$ is iridium.

7. The organic electroluminescence element material of claim 1, wherein $M_{11}$ is platinum.

8. The organic electroluminescence element material of claim 2, wherein $M_{11}$ is platinum.

9. The organic electroluminescence element material of claim 3, wherein $M_{12}$ is platinum.

10. An organic electroluminescence element comprising the organic electroluminescence element material of claim 1.

11. The organic electroluminescence element of claim 10, wherein the element is provided with at least one emission layer as a constituent layer.

12. The organic electroluminescence element of claim 10, wherein the element is provided with at least one emission layer and one positive hole inhibition layer, serving as constituent layers.

13. A display device comprising the organic electroluminescence element of claim 10.

14. An illumination device comprising the organic electroluminescence element of claim 10.

* * * * *